(12) United States Patent
Kanetake et al.

(10) Patent No.: US 11,482,479 B2
(45) Date of Patent: Oct. 25, 2022

(54) SEMICONDUCTOR DEVICE

(71) Applicant: Rohm Co., Ltd., Kyoto (JP)

(72) Inventors: Yasuo Kanetake, Kyoto (JP); Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 403 days.

(21) Appl. No.: 16/500,258

(22) PCT Filed: Apr. 20, 2018

(86) PCT No.: PCT/JP2018/016267
§ 371 (c)(1),
(2) Date: Oct. 2, 2019

(87) PCT Pub. No.: WO2018/198957
PCT Pub. Date: Nov. 1, 2018

(65) Prior Publication Data
US 2020/0066620 A1 Feb. 27, 2020

(30) Foreign Application Priority Data

Apr. 24, 2017 (JP) .............................. JP2017-085391

(51) Int. Cl.
*H01L 23/498* (2006.01)
*H01L 23/31* (2006.01)
*H01L 29/16* (2006.01)

(52) U.S. Cl.
CPC ...... *H01L 23/49811* (2013.01); *H01L 23/315* (2013.01); *H01L 23/49844* (2013.01); *H01L 29/1608* (2013.01)

(58) Field of Classification Search
CPC ............. H01L 23/49811; H01L 23/315; H01L 23/49844
See application file for complete search history.

(56) References Cited

U.S. PATENT DOCUMENTS

2002/0019072 A1 2/2002 Kobayashi et al.
2009/0045493 A1 2/2009 Yong et al.
(Continued)

FOREIGN PATENT DOCUMENTS

DE 10 2015 104 990 A1 10/2016
JP 8-97333 A 4/1996
(Continued)

OTHER PUBLICATIONS

International Search Report issued in PCT/JP2018/016267, dated Jun. 5, 2018 (2 pages).
(Continued)

*Primary Examiner* — Errol V Fernandes
(74) *Attorney, Agent, or Firm* — Hamre, Schumann, Mueller & Larson, P.C.

(57) ABSTRACT

A semiconductor device of an aspect of the disclosure includes a switching element, a substrate, a front electro-conductive layer, first through third terminals and a sealing resin. The first through third terminals project toward the same side from the sealing resin along a first direction crossing the substrate thickness direction. The first through third terminals are spaced apart in a second direction crossing the thickness and first directions. The first terminal is at an outermost side in the second direction among the first through third terminals. The sealing resin has root-side and tip-side parts. The root-side part is between the first and third terminals in the second direction and offset in the first direction toward the switching element side of the first and third terminals. The tip-side part is offset in the first direction toward the tip side of the first and third terminals exposed from the sealing resin.

29 Claims, 20 Drawing Sheets

(56) References Cited

U.S. PATENT DOCUMENTS

| | | | |
|---|---|---|---|
| 2012/0175762 A1* | 7/2012 | Hata | H01L 23/49548 |
| | | | 257/E23.101 |
| 2012/0199991 A1* | 8/2012 | Okamoto | H01L 23/3142 |
| | | | 257/E23.117 |
| 2016/0293549 A1 | 10/2016 | Otremba et al. | |
| 2016/0315037 A1* | 10/2016 | Kadoguchi | H01L 24/33 |

FOREIGN PATENT DOCUMENTS

| | | |
|---|---|---|
| JP | 2001-148392 A | 5/2001 |
| JP | 2009-278134 A | 11/2009 |
| JP | 2015-19115 A | 1/2015 |
| JP | 2015-76257 A | 4/2015 |
| JP | 2017-5043 A | 1/2017 |

OTHER PUBLICATIONS

Office Action received in the corresponding German Patent application, dated Jul. 29, 2022 and machine translation (22 pages).

* cited by examiner

SEMICONDUCTOR DEVICE

TECHNICAL FIELD

The present disclosure relates to a semiconductor device.

BACKGROUND ART

A switching device used in an electronic circuit such as an inverter circuit or a converter circuit includes a switching element. Known examples of such a switching element are an Si switching element and an SiC switching element. Examples of SiC switching elements include an SiC-MOSFET (Metal-Oxide-Semiconductor Field Effect Transistor), an SiC-bipolar transistor, an SiC-JFET (Junction Field Effect Transistor), an SiC-IGBT (Insulated Gate Bipolar Transistor) and so on.

SUMMARY OF THE INVENTION

An object of the present disclosure is to provide an improved semiconductor device. Specifically, without limitation, an object is to provide a semiconductor device that is capable of improving the withstand voltage and response speed.

According to a first aspect of the present disclosure, there is provided a semiconductor device including: a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode; a substrate having a front surface and a back surface and made of an insulating material; a front electroconductive layer formed on the front surface of the substrate and including a first electrode part to which the first electrode of the switching element is bonded; a first terminal electrically connected to the first electrode via the first electrode part; a second terminal electrically connected to the second electrode; a third terminal electrically connected to the third electrode; and a sealing resin that covers at least a part of the front electroconductive layer, a part of each of the first through the third terminals, and the switching element. The first through the third terminals project toward a same side from the sealing resin along a first direction perpendicular to a thickness direction of the substrate. The first through the third terminals are spaced apart from each other in a second direction perpendicular to the thickness direction and the first direction. The first terminal is located at an outermost side in the second direction among the first through the third terminals. The sealing resin includes: a root-side part that is located between the first terminal and the third terminal in the second direction and offset in the first direction toward a switching element side of the first terminal and the third terminal; and a tip-side part that is offset in the first direction toward a tip side of the first and the third terminals that is exposed from the sealing resin.

According to a second aspect of the present disclosure, there is provided a semiconductor device including: a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode; a substrate having a front surface and a back surface and made of an insulating material; a front electroconductive layer formed on the front surface of the substrate and including a first electrode part to which the first electrode of the switching element is bonded; a first terminal electrically connected to the first electrode via the first electrode part; a second terminal electrically connected to the second electrode; a third terminal electrically connected to the third electrode; and a sealing resin that covers at least a part of the front electroconductive layer, a part of each of the first through the third terminals, and the switching element. The first through the third terminals project toward a same side from the sealing resin along a first direction perpendicular to a thickness direction of the substrate. The first through the third terminals are spaced apart from each other in a second direction perpendicular to both the thickness direction and the first direction. The first terminal is located at an outermost side in the second direction among the first through the third terminals. A distance between the first terminal and the third terminal in the second direction is larger than a distance between the third terminal and the second terminal in the second direction.

According to a third aspect of the present disclosure, there is provided a semiconductor device including: a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode; a first terminal including a first electrode part to which the first electrode of the switching element is bonded; a second terminal electrically connected to the second electrode; a third terminal electrically connected to the third electrode; and a sealing resin that covers at least a part of the first electrode part, a part of each of the first through the third terminals, and the switching element. The first through the third terminals project toward a same side from the sealing resin along a first direction perpendicular to a thickness direction of the switching element. The first through the third terminals are spaced apart from each other in a second direction perpendicular to both the thickness direction and the first direction. The first terminal is located at an outermost side in the second direction among the first through the third terminals. The sealing resin includes: a root-side part that is located between the first terminal and the third terminal in the second direction and offset in the first direction toward a switching element side of the first terminal and the third terminal; and a tip-side part that is offset in the first direction toward a tip side of the first and/or the third terminals that is exposed from the sealing resin.

According to a fourth aspect of the present disclosure, there is provided a semiconductor device including: a switching element having a first electrode, a second electrode and a third electrode and configured such that ON/OFF control between the first electrode and the third electrode is provided by a driving voltage applied across the second electrode and the third electrode with a potential difference applied between the first electrode and the third electrode; a first terminal including a first electrode part to which the first electrode of the switching element is bonded; a second terminal electrically connected to the second electrode; a third terminal electrically connected to the third electrode; a fourth terminal electrically connected to the third electrode; and a sealing resin that covers at least a part of the first electrode part, a part of each of the first through the fourth terminals, and the switching element. The first through the fourth terminals project toward a same side from the sealing resin along a first direction perpendicular to a thickness direction of the switching element. The first through the fourth terminals are spaced apart from each other in a second direction perpendicular to both the thickness direction and the first direction. The third terminal is located at a center in the second direction among the first through the fourth terminals. An inductance between the third electrode and the third terminal is smaller than an inductance between the third electrode and the fourth terminal.

Other features and advantages of the present disclosure will become apparent from the detailed description given below with reference to the accompanying drawings.

MODE FOR CARRYING OUT THE INVENTION

Figure 1:
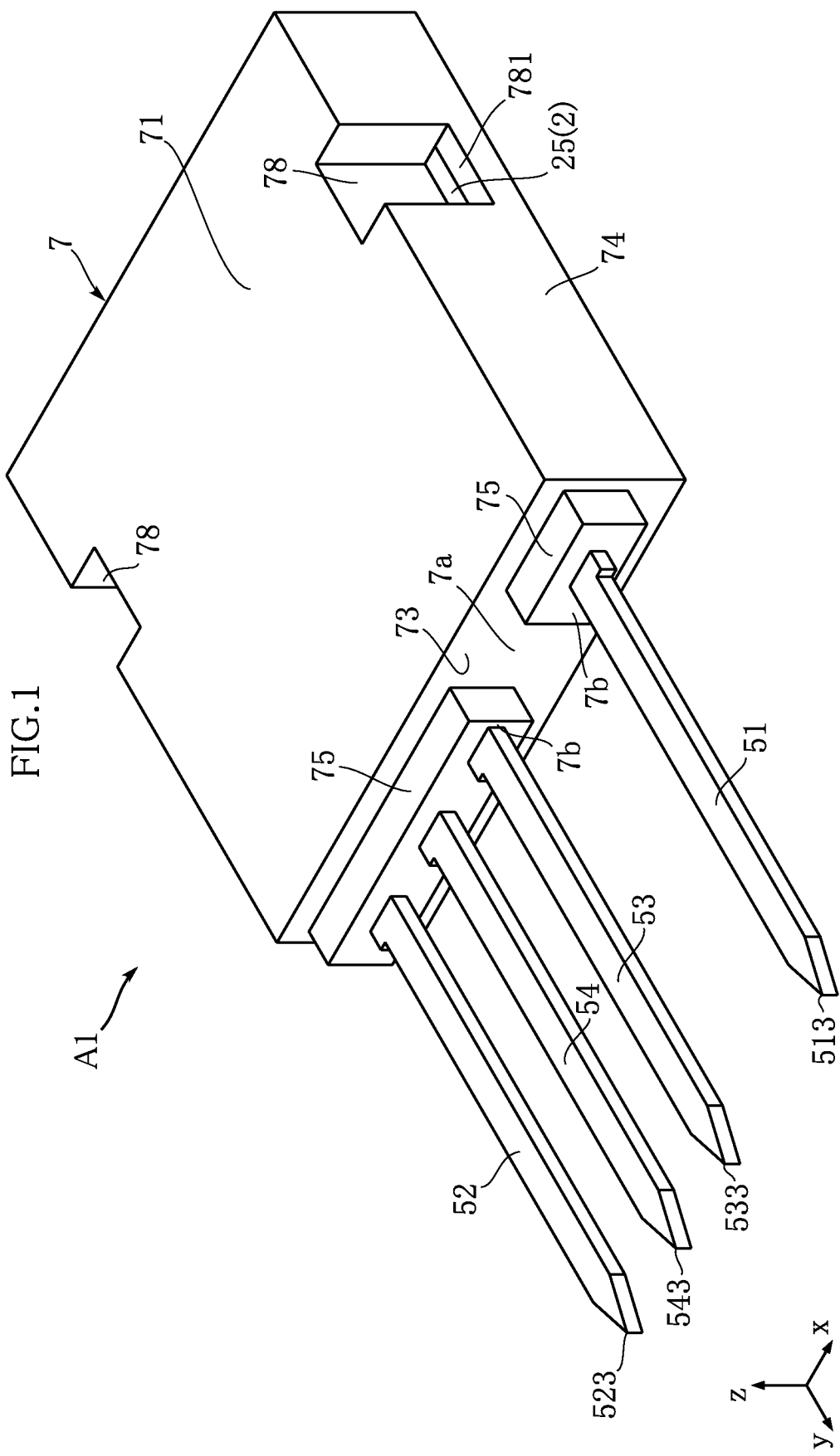
FIG. 1 is a perspective view of a semiconductor device according to a first embodiment of the present disclosure.

Preferred embodiments of the present disclosure are described below with reference to the accompanying drawings.

First Embodiment

FIGS. 1-10 show a semiconductor device according to a first embodiment of the present disclosure. The semiconductor device A1 of the present embodiment includes a substrate 1, a front electroconductive layer 2, a back electroconductive layer 3, a switching element 4, a drain terminal 51, a gate terminal 52, a source terminal 53, a source sense terminal 54, a gate wire 62, a plurality of source wires 63, a source sense wire 64 and a sealing resin 7.

Figure 2:
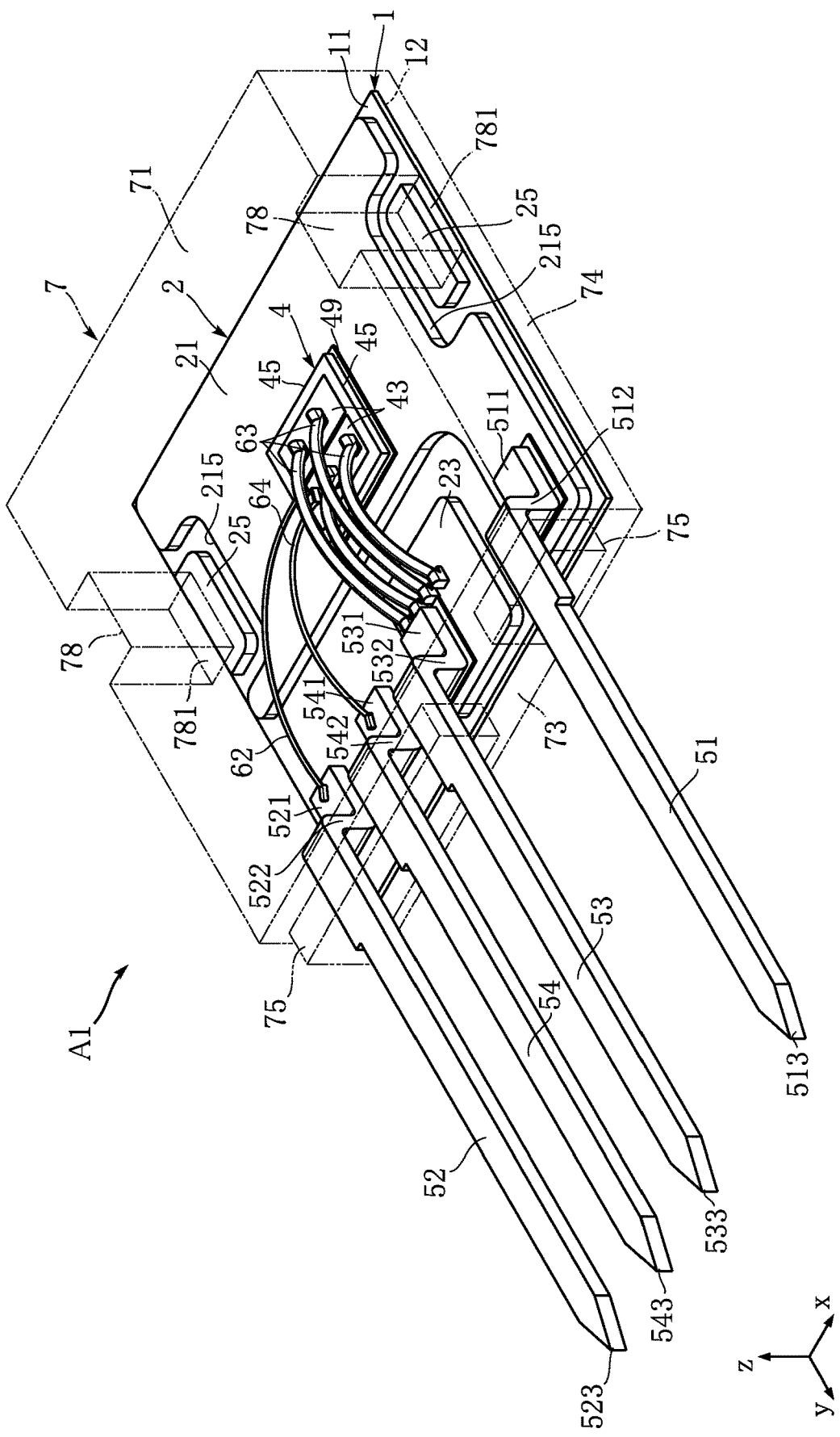
FIG. 2 is a perspective view showing main parts of the semiconductor device according to the first embodiment of the present disclosure.
Figure 3:
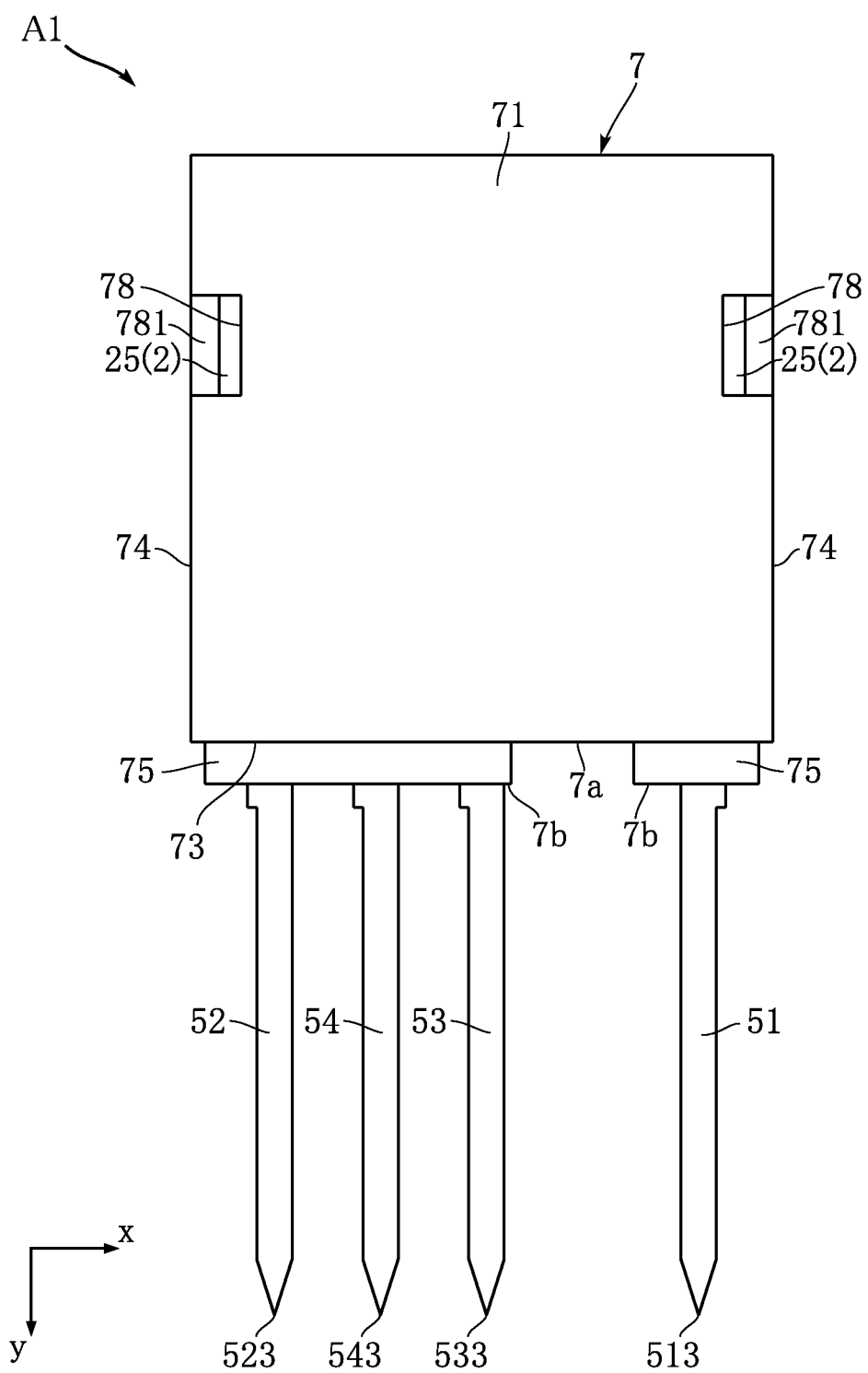
FIG. 3 is a plan view of the semiconductor device according to the first embodiment of the present disclosure.
Figure 4:
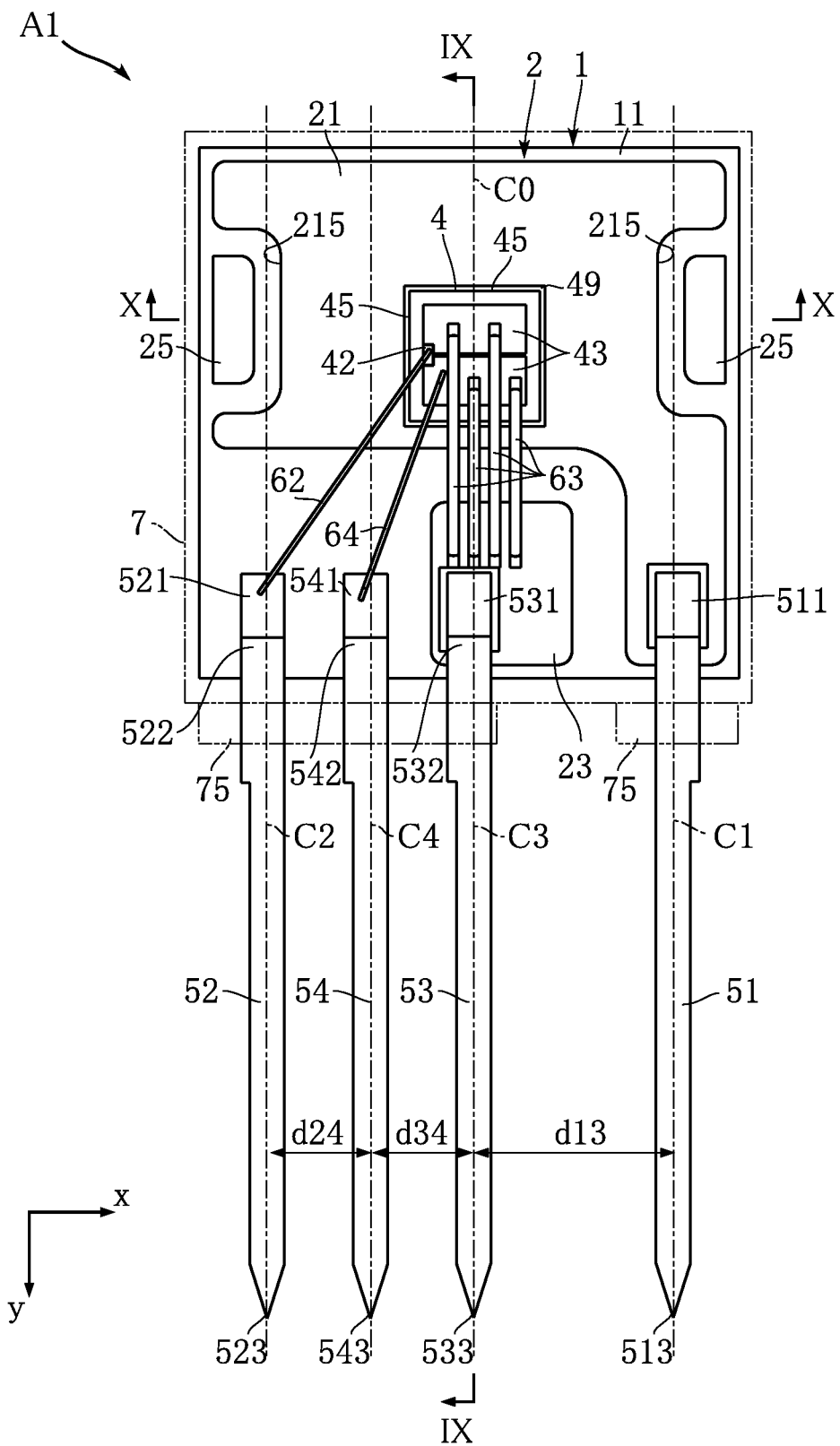
FIG. 4 is a plan view showing main parts of the semiconductor device according to the first embodiment of the present disclosure.
Figure 5:
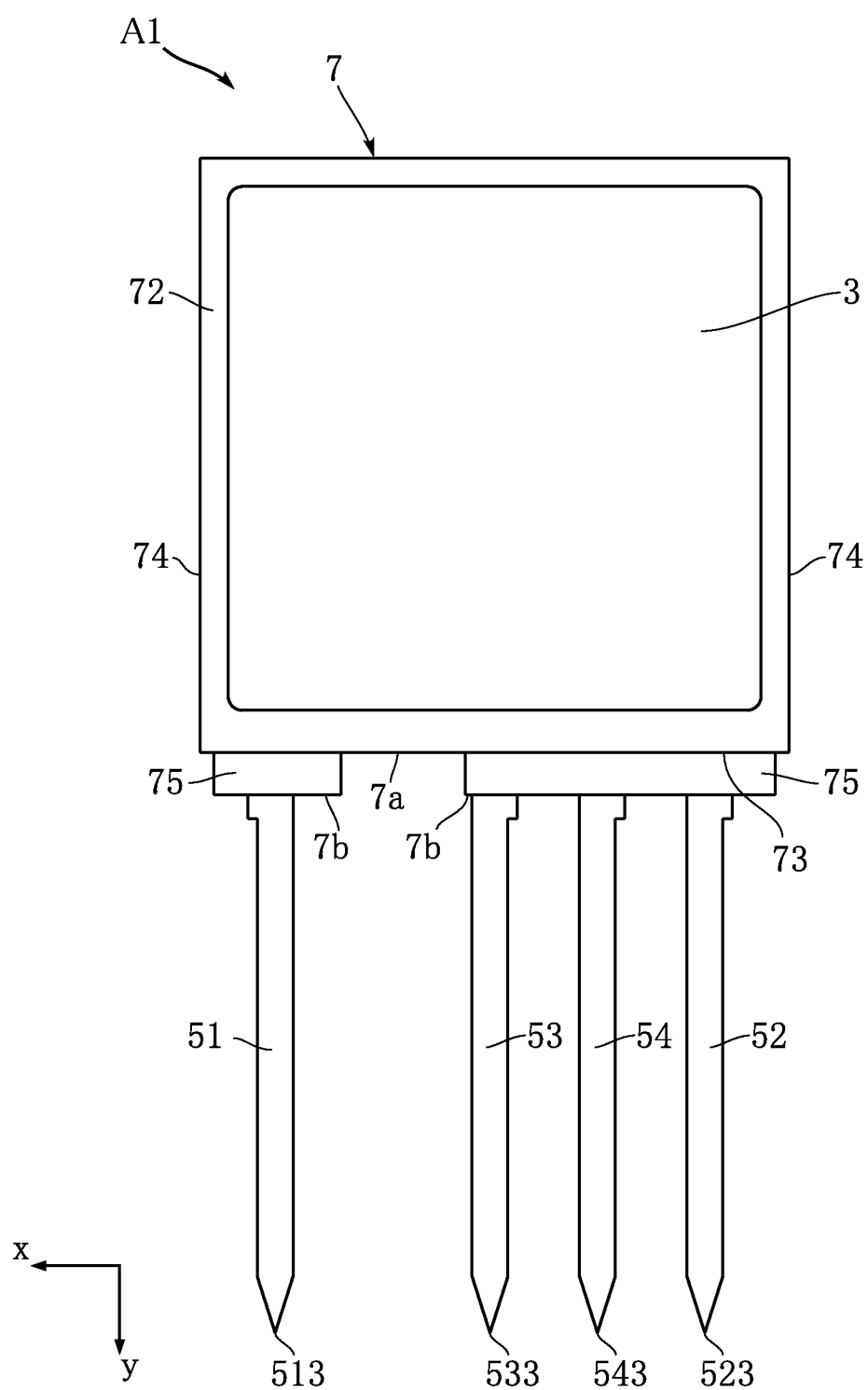
FIG. 5 is a bottom view of the semiconductor device according to the first embodiment of the present disclosure.
Figure 6:
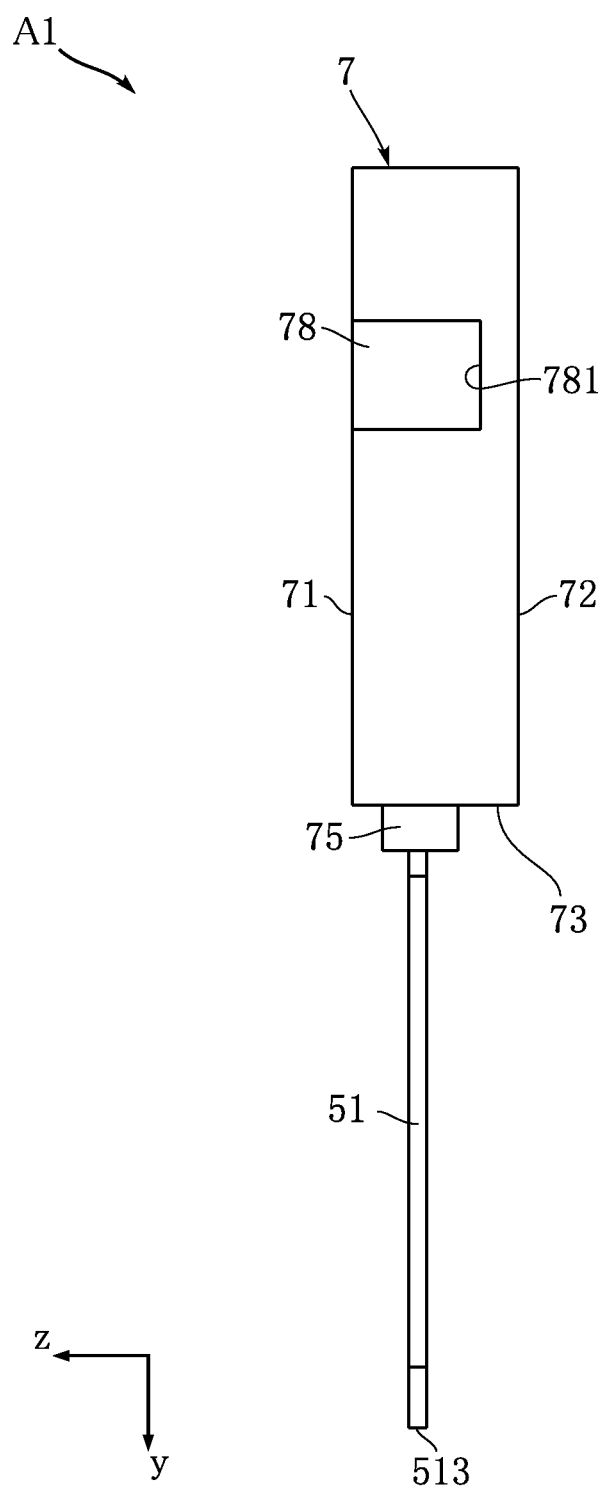
FIG. 6 is a right side view of the semiconductor device according to the first embodiment of the present disclosure.
Figure 7:
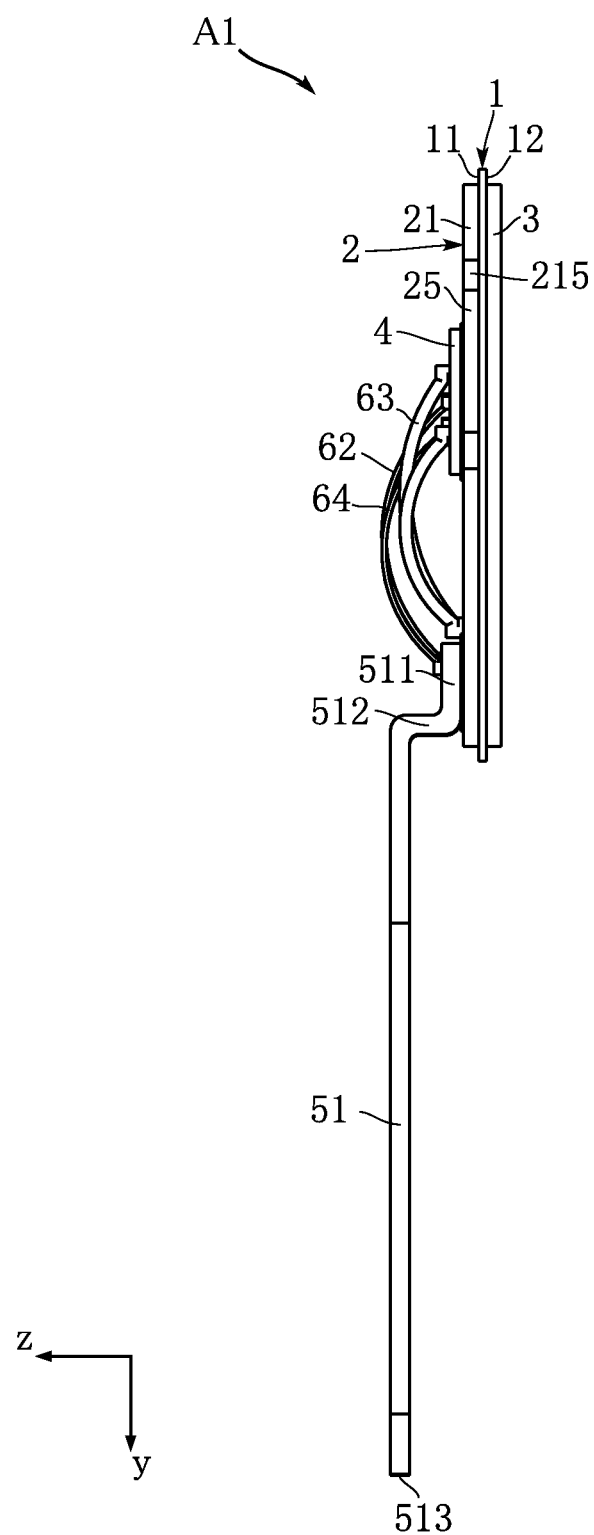
FIG. 7 is a right side view showing main parts of the semiconductor device according to the first embodiment of the present disclosure.
Figure 8:
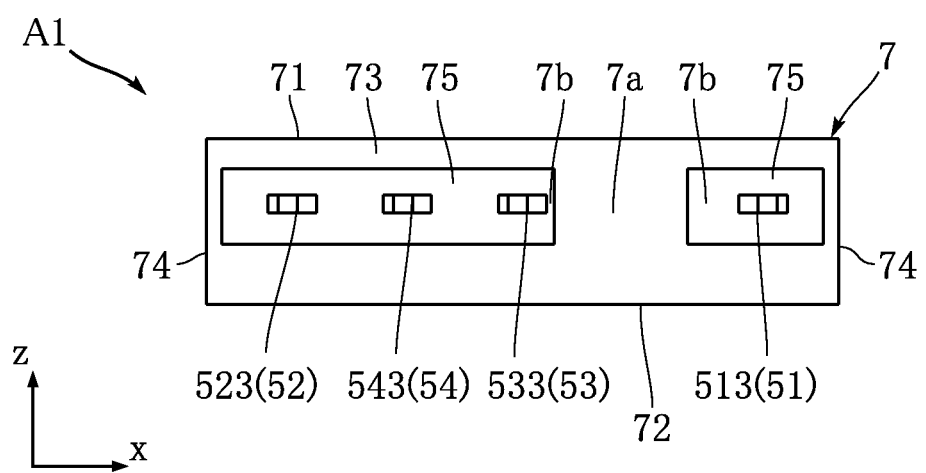
FIG. 8 is a front view of the semiconductor device according to the first embodiment of the present disclosure.
Figure 9:
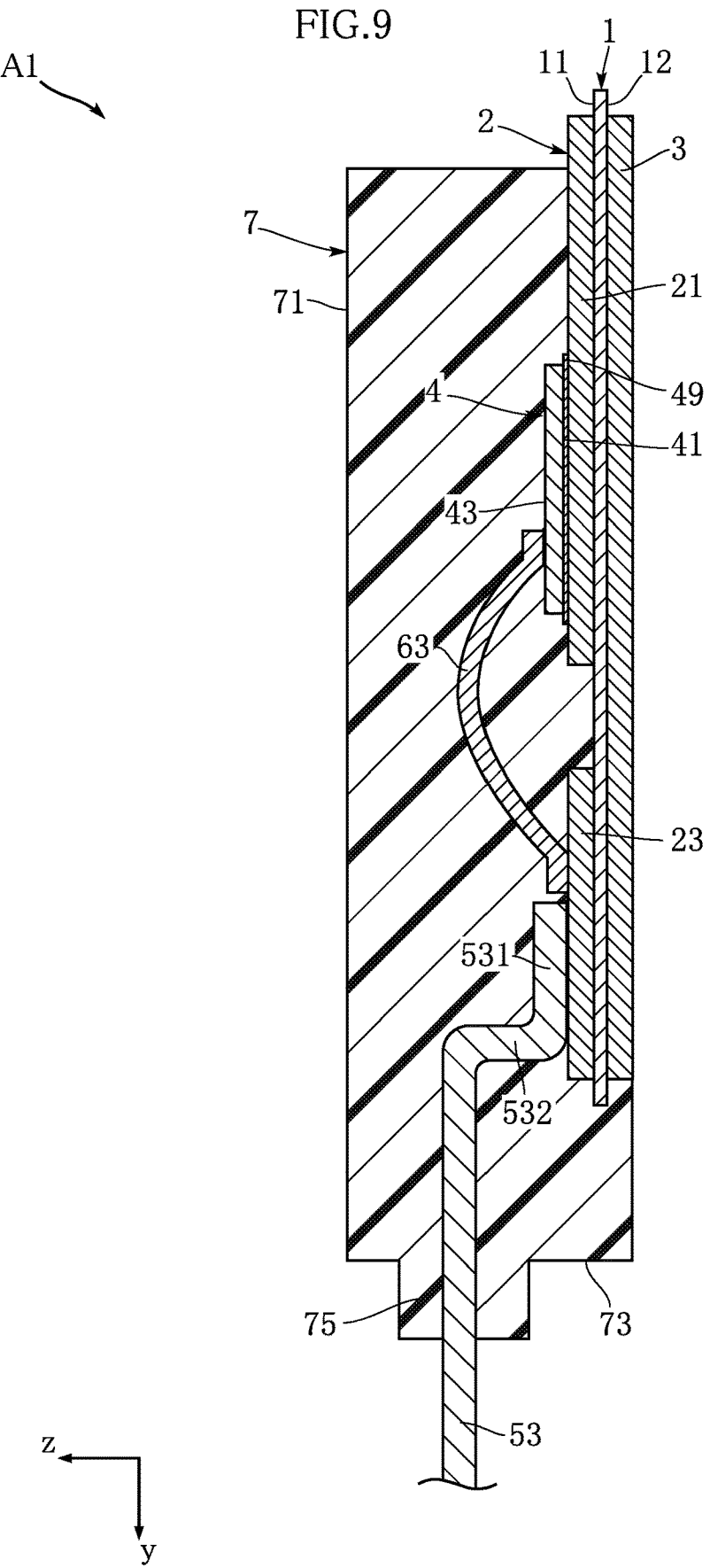
FIG. 9 is a schematic sectional view taken along line IX-IX in FIG. 4.
Figure 10:
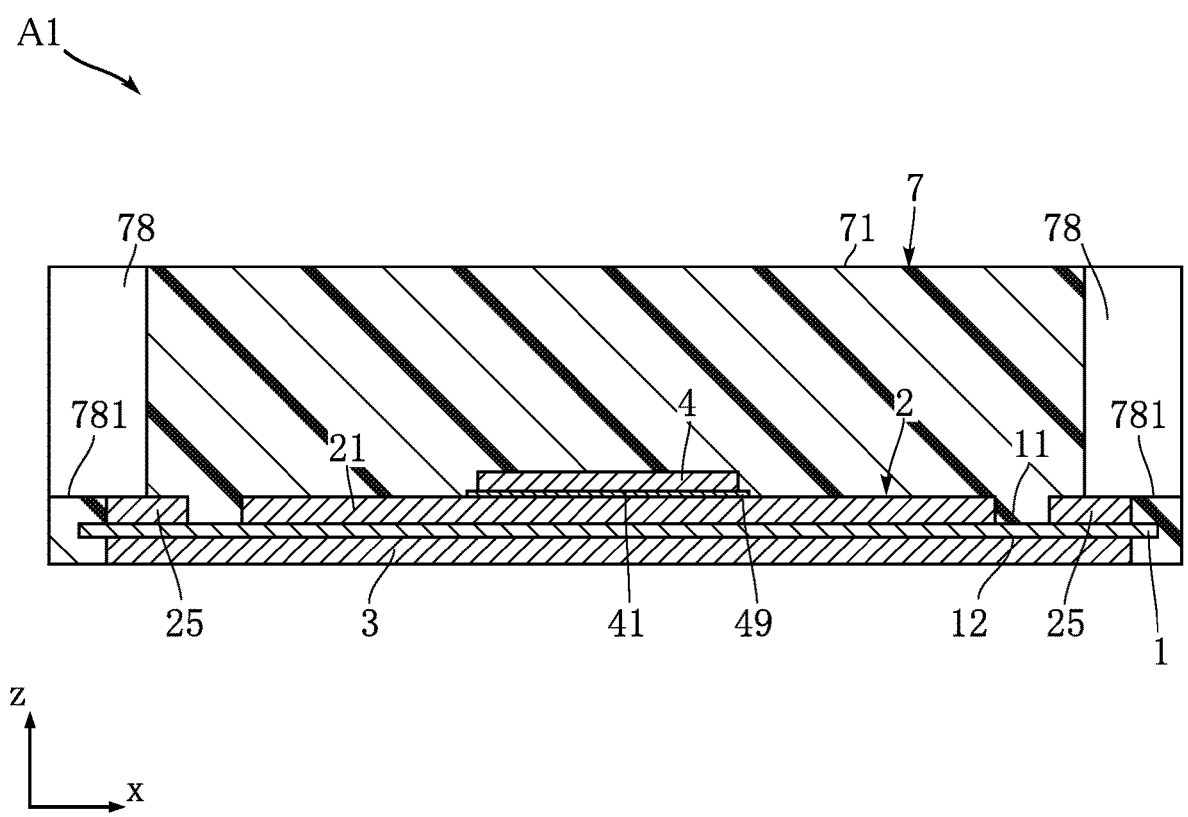
FIG. 10 is a sectional view taken along line X-X in FIG. 4.

FIG. 1 is a perspective view of the semiconductor device A1. FIG. 2 is a perspective view showing main parts of the semiconductor device A1. FIG. 3 is a plan view of the semiconductor device A1. FIG. 4 is a plan view showing main parts of the semiconductor device A1. FIG. 5 is a bottom view of the semiconductor device A1. FIG. 6 is a right side view of the semiconductor device A1. FIG. 7 is a right side view showing main parts of the semiconductor device A1. FIG. 8 is a front view of the semiconductor device A1. FIG. 9 is a schematic sectional view taken along line IX-IX in FIG. 4. FIG. 10 is a sectional view taken along line X-X in FIG. 4. For convenience of understanding, the sealing resin 7 is depicted by imaginary lines in FIG. 2, and illustration of the sealing resin 7 is omitted in FIGS. 2 and 7. In the figures, the z direction is an example of the thickness direction, the y direction is an example of the first direction, and the x direction is an example of the second direction.

The substrate 1 is a plate-like member made of an insulating material and supports the switching element 4. As shown in FIG. 4, the substrate 1 is rectangular as viewed in the z direction in the present embodiment. Examples of the material for the substrate 1 include, without limitation, ceramics such as alumina, aluminum nitride, silicon nitride, boron nitride and graphite. The substrate 1 has a front surface 11 and a back surface 12. The front surface 11 and the back surface 12 are flat surfaces facing opposite in the z direction.

The front electroconductive layer 2 is formed on the front surface 11 of the substrate 1 and mainly serves to provide a conduction path for the switching element 4. The material for the front electroconductive layer 2 is not particularly limited. The front electroconductive layer may be made of a metal such as Cu or its alloy and may be provided with an Ni or Ag plating layer as needed. The method for forming the front electroconductive layer 2 is not limited. For example, the front electroconductive layer may be formed by bonding a metal plate to the front surface 11 of the substrate 1.

In the present embodiment, the front electroconductive layer 2 includes a drain electrode part 21, a source electrode part 23 and a plurality of isolated parts 25.

The drain electrode part 21, which is an example of the first electrode part, is a portion to which the switching element 4 is mounted and the drain terminal 51 is bonded. In the present embodiment, the drain electrode part 21 has an area that accounts for more than a half of the area of the front electroconductive layer 2. More specifically, the drain electrode part 21 has a portion that almost entirely covers an upper portion of the substrate 1 in the y direction in the figures, and another portion that covers a right end in the x direction in the figures of a lower portion of the substrate 1 in the y direction in the figures. In the present embodiment, the drain electrode part 21 has two cutouts 215. The two cutouts 215 are formed at opposite sides of the drain electrode part 21 in the x direction and recessed inward in the x direction from the edges of the drain electrode part 21 in the x direction.

The source electrode part 23, which is an example of the third electrode part, is a portion which is electrically connected to a source electrode 43 of the switching element 4 that is described later and to which the source terminal 53 is bonded. The source electrode part 23 is spaced apart from the drain electrode part 21. The source electrode part 23 is located, in the x direction, next to a lower portion of the drain electrode part 21 in the y direction in the figures and generally rectangular as viewed in the z direction in the present embodiment.

The plurality of isolated parts 25 are spaced apart from the drain electrode part 21 and the source electrode part 23 and insulated from the drain electrode part 21, the source electrode part 23 and the switching element 4. That is, the plurality of isolated parts 25 do not constitute the conduction path to the switching element 4. Two isolated parts 25 are provided in the present embodiment, though this is merely an example, and the number of the isolated parts 25 may be varied. The two isolated parts 25 are arranged within the two cutouts 215 of the drain electrode part 21, respectively.

As shown in FIGS. 5, 7 and 9, the back electroconductive layer 3 is formed on the back surface 12 of the substrate 1. The back electroconductive layer 3 is insulated from the drain electrode part 21 and the switching element 4. In the present embodiment, the back electroconductive layer 3 is sized and shaped to cover most of the back surface 12 of the substrate 1. That is, as viewed in the z direction, the back electroconductive layer 3 overlaps with almost the entire drain electrode part 21 and the switching element 4.

The switching element 4 is made using Si or SiC as the base material and realizes the switching function of the semiconductor device A1. Examples of the switching element 4 include an SiC-MOSFET (Metal-Oxide-Semiconductor Field Effect Transistor), an SiC-bipolar transistor, an SiC-JFET (Junction Field Effect Transistor), an SiC-IGBT (Insulated Gate Bipolar Transistor) and so on. In the present embodiment, description is given of the case where the switching element 4 is an SiC-MOSFET that is most suitable for achieving improved withstand voltage and response speed.

As shown in FIGS. 2, 4, 9 and 10, the switching element 4 has a drain electrode 41 formed on a chip back side, and a gate electrode 42 and a source electrode 43 formed on a chip front side. The drain electrode 41 is an example of the first electrode. The drain electrode 41 is formed on a surface of the switching element 4 that faces the drain electrode part 21. The gate electrode 42, which is an example of the second electrode, is formed on a surface of the switching element 4 that is opposite to the surface on which the drain electrode 41 is formed. The source electrode 43, which is an example of the third electrode, is formed on the surface of the switching element 4 on which the gate electrode 42 is formed. The source electrode 43 is considerably larger than the gate electrode 42 and covers most of the one surface of the switching element 4. The front surface of the semiconductor substrate beneath the source electrode 43 is formed with a number of SiC-MOSFETs having a trench structure, and the source electrodes and the gate electrodes of the respective transistors are connected in parallel to the source electrode 43 and the gate electrode 42.

In the switching element 4, ON/OFF control between the drain electrode 41 and the source electrode 43 is performed by applying a driving voltage across the gate electrode 42 and the source electrode 43 while a potential difference is being applied between the drain electrode 41 and the source electrode 43.

The switching element 4 is mounted on the substrate 1 by bonding the drain electrode 41 of the switching element 4 to the drain electrode part 21 of the front electroconductive layer 2 using a bonding material 49. To electrically connect the drain electrode 41 of the switching element 4 and the drain electrode part 21 of the front electroconductive layer 2, the bonding material 49 is an electroconductive bonding material formed by using TiNiAg-based solder, SnAgCu-based solder or baked silver, for example.

In the present embodiment, the switching element 4 has a rectangular shape with four outer edges 45. The switching element 4 of the present embodiment is arranged in a manner such that two of the outer edges 45 extend along the x direction and the other two outer edges 45 extend along the y direction.

The drain terminal 51, the gate terminal 52, the source terminal 53 and the source sense terminal 54 provide a conduction path that connects the outside of the semiconductor device A1 and the switching element 4 and used when the semiconductor device A1 is mounted on a circuit board (not shown), for example. The drain terminal 51, the gate terminal 52, the source terminal 53 and the source sense terminal 54 are made of a metal such as Cu, for example, and may be formed by cutting a metal lead frame.

The drain terminal 51, which is an example of the first terminal, is electrically connected to the drain electrode 41 of the switching element 4 via the drain electrode part 21. As shown in FIGS. 1-4 and 7, the drain terminal 51 extends along the y direction and includes a bond part 511, a bent part 512 and a tip 513. The bond part 511 is bonded to the drain electrode part 21 and is a root part of the drain terminal 51. The method for bonding the bond part 511 and the drain electrode part 21 is not particularly limited, and various methods such as bonding using an electroconductive bonding material, ultrasonic bonding or resistance welding may appropriately be employed. In the present embodiment, an electroconductive bonding material is used. The bent part 512 is a portion with a bent shape connected to the bond part 511 and shaped in a manner such that the portion between the bent part 512 and the tip 513 is offset from the back electroconductive layer 3 in the z direction. The tip 513 is the end of the drain terminal 51 that is located on the opposite side to the bond part 511. As viewed in the z direction, the drain terminal 51 is located at the outermost side (right side in the figures) in the x direction.

The source terminal 53, which is an example of the third terminal, is electrically connected to the source electrode 43 of the switching element 4 via the source electrode part 23. As shown in FIGS. 1-4, the source terminal 53 extends along the y direction and includes a bond part 531, a bent part 532 and a tip 533. The bond part 531 is bonded to the source electrode part 23 and is a root part of the source terminal 53. The method for bonding the bond part 531 and the source electrode part 23 is not particularly limited, and various methods such as bonding using an electroconductive bonding material, ultrasonic bonding or resistance welding may appropriately be employed. In the present embodiment, an electroconductive bonding material is used. The bent part 532 is a portion with a bent shape connected to the bond part 531 and shaped in a manner such that the portion between the bent part 532 and the tip 533 is offset from the back electroconductive layer 3 in the z direction. The tip 533 is the end of the source terminal 53 that is located on the opposite side to the bond part 531. As viewed in the z direction, the source terminal 53 is located next to the drain terminal 51 in the x direction.

The gate terminal 52, which is an example of the second terminal, is electrically connected to the gate electrode 42 of the switching element 4. As shown in FIGS. 1-4, the gate terminal 52 extends along the y direction and includes a bond part 521, a bent part 522 and a tip 523. The bond part 521 is bonded to the front surface 11 of the substrate 1 and is a root part of the gate terminal 52. The method for bonding the bond part 521 and the front surface 11 of the substrate 1 is not particularly limited, and bonding using various types of electroconductive bonding material may appropriately be employed. The bent part 522 is a portion with a bent shape connected to the bond part 521 and shaped in a manner such that the portion between the bent part 522 and the tip 523 is offset from the back electroconductive layer 3 in the z direction. The tip 523 is the end of the gate terminal 52 that is located on the opposite side to the bond part 521. The gate terminal 52 is disposed on the opposite side of the drain terminal 51 in the x direction with respect to the source terminal 53, as viewed in the z direction.

The source sense terminal 54, which is an example of the fourth terminal, is electrically connected to the source electrode 43 of the switching element 4. As shown in FIGS. 1-4, the source sense terminal 54 extends along the y direction and includes a bond part 541, a bent part 542 and a tip 543. The bond part 541 is bonded to the front surface 11 of the substrate 1 and is a root part of the source sense terminal 54. The method for bonding the bond part 541 and the front surface 11 of the substrate 1 is not particularly limited, and bonding using various types of electroconductive bonding material may appropriately be employed. The bent part 542 is a portion with a bent shape connected to the bond part 541 and shaped in a manner such that the portion between the bent part 542 and the tip 543 is offset from the back electroconductive layer 3 in the z direction. The tip 543 is the end of the source sense terminal 54 that is located on the opposite side to the bond part 541. The source sense terminal 54 is disposed on the opposite side of the drain terminal 51 in the x direction with respect to the source terminal 53 as viewed in the z direction, and disposed between the gate terminal 52 and the source terminal 53 in the x direction in the illustrated example. Note that the gate wire 62 and the source sense wire 64 can be exchanged. That is, the arrangement of the gate terminal 52 and the source sense terminal 54 in the x direction is not limited to that illustrated in the figures, and the position of the gate terminal 52 and that of the source sense terminal 54 may be reversed from the illustrated arrangement. The same applies to other embodiments described later. Also, the gate terminal 52, the source terminal 53 and the source sense terminal 54 do not necessarily include the bent parts 522, 532 and 542. Specifically, the gate terminal 52, the source terminal 53 and the source sense terminal 54 each having a flat shape without a bent part may be arranged at a position offset from the back electroconductive layer 3 in the z direction, and the gate wire 62, the source wires 63 and the source sense wire 64 may be bonded to such a gate terminal 52, source terminal 53 and source sense terminal 54, respectively. Such an arrangement reduces the manufacturing cost while increasing the distance between the back electroconductive layer 3 and the gate terminal 52, the source terminal 53 or the source sense terminal 54.

As shown in FIG. 4, the distance d13 in the x direction between the center line C1 of the drain terminal 51 and the center line C3 of the source terminal 53 is larger than the distance d34 between the center line C3 of the source terminal 53 and the center line C4 of the source sense terminal 54. Also, the distance d13 is larger than the distance d24 between the center line C2 of the gate terminal 52 and the center line C4 of the source sense terminal 54. In the present embodiment, the distance d24 and the distance d34 are approximately the same.

As shown in FIG. 8, in the present embodiment, the tip 513 of the drain terminal 51, the tip 523 of the gate terminal 52, the tip 533 of the source terminal 53 and the tip 543 of the source sense terminal are almost at the same position in the z direction. Also, the drain terminal 51, the gate terminal 52, the source terminal 53 and the source sense terminal 54 project from almost the same position on the sealing resin 7 in the z direction.

As shown in FIG. 4, the phantom line as an extension of the center line C3 of the source terminal 53 in the y direction intersects the switching element 4. The phantom line as an extension of the center line C1 of the drain terminal 51 in the y direction does not intersect the switching element 4.

As shown in FIGS. 2 and 4, the gate wire 62 is bonded to the gate electrode 42 of the switching element 4 and the bond part 521 of the gate terminal 52 to electrically connect the gate electrode 42 of the switching element 4 and the gate terminal 52. The material for the gate wire 62 is not particularly limited, though a wire made of Al-Ni is used in the present embodiment. In the present embodiment, the gate electrode 42 and the gate terminal 52 are electrically connected to each other by a single gate wire 62. As viewed in the z direction, the gate wire 62 is inclined with respect to both of the x direction and the y direction.

As shown in FIGS. 2, 4, 7 and 8, each of the source wires 63 is bonded to the source electrode 43 of the switching element 4 and the source electrode part 23 of the front electroconductive layer 2 to electrically connect the source electrode 43 of the switching element 4 to the source electrode part 23 and the source terminal 53. The material for the source wires 63 is not particularly limited, though wires made of Al are used in the present embodiment. The wire diameter of the source wires 63 is larger than those of the gate wire 62 and the source sense wire 64. In the present embodiment, the source wires 63 extend along the y direction and are spaced apart from each other in the x direction. In the present embodiment, four source wires 63 are provided.

As shown in FIGS. 2 and 4, the source sense wire 64 is bonded to the source electrode 43 of the switching element 4 and the bond part 541 of the source sense terminal 54 to electrically connect the source electrode 43 of the switching element 4 and the source sense terminal 54. The material for the source sense wire 64 is not particularly limited. In the present embodiment, use may be made of a plurality of wires made of Al-Ni and thicker than the wire used for connecting the gate electrode. In the present embodiment, a single source sense wire 64 having approximately the same thickness as the wire of the gate electrode is used to electrically connect the source electrode 43 and the source terminal 53. As viewed in the z direction, the source sense wire 64 is inclined with respect to both the x direction and the y direction.

Both of the source terminal 53 and the source sense terminal 54 are electrically connected to the source electrode 43 of the switching element 4. Specifically, the source terminal 53 and the source sense terminal 54 are electrically connected to each other only via a conduction path provided by the series connection of the source electrode part 23, the source wires 63, the source electrode 43 and the source sense wire 64. That is, the source terminal 53 and the source sense terminal 54 are electrically connected to each other only via a conduction path that includes the source electrode 43 and are not electrically connected to each other via a conduction path that does not include the source electrode 43.

The resistance and inductance between the source electrode 43 and the tip 533 of the source terminal 53 is the sum of the resistances and inductances of the plurality of source wires 63, the source electrode part 23 and the source terminal 53. On the other hand, the resistance and inductance between the source electrode 43 and the tip 543 of the source sense terminal 54 is the sum of the resistances and inductances of the source sense wire 64 and the source sense terminal 54. Because of the above-described arrangement of the plurality of source wires 63 and the source sense wire 64, the resistance and inductance between the source electrode 43 and the tip 533 of the source terminal 53 is smaller than the resistance and inductance between the source electrode 43 and the tip 543 of the source sense terminal 54.

The sealing resin 7 covers a part of the substrate 1, a part of the front electroconductive layer 2, a part of the back electroconductive layer 3, the switching element 4, a part of the drain terminal 51, a part of the gate terminal 52, a part of the source terminal 53, a part of the source sense terminal 54, the gate wire 62, the plurality of source wires 63 and the source sense wire 64 for protection. The material for the sealing resin 7 is not particularly limited. The sealing resin may be made of black epoxy resin, in which a filler may be mixed as needed.

In the present embodiment, the sealing resin 7 includes a front surface 71, a back surface 72, an end surface 73 and a pair of side surfaces 74. The front surface 71 faces in the direction in which the front surface 11 of the substrate 1 faces. The back surface 72 faces in the direction in which the back surface 12 of the substrate 1 faces. The end surface 73 connects the front surface 71 and the back surface 72 and faces in the y direction. The paired side surfaces 74 connect the front surface 71 and the back surface 72 and face opposite to each other in the x direction.

As shown in FIGS. 5 and 9, in the present embodiment, one surface of the back electroconductive layer 3 is entirely exposed from the back surface 72 of the sealing resin 7. This surface of the back electroconductive layer 3 is flush with the back surface 72.

As shown in FIGS. 1, 3, 5, 6 and 8, in the present embodiment, the sealing resin 7 has two projections 75. The two projections 75 project from the end surface 73 in they direction and are in the form of a rectangular parallelepiped in the illustrated example. The two projections 75 are spaced apart from each other in the x direction. The drain terminal 51 projects form the projection 75 on the right side in FIG. 3, whereas the gate terminal 52, the source terminal 53 and the source sense terminal 54 project from the projection 75 on the left side in the figure.

With the two projections 75 formed on the end surface 73, the sealing resin 7 has a root-side part 7a and a tip-side part 7b. The root-side part 7a is a portion that is offset in the y direction toward the root side of the drain terminal 51 and source terminal 53 (toward the bond part 511 and the bond part 531), between the drain terminal 51 and the source terminal 53 in the x direction. In the present embodiment, the root-side part 7a is provided by the portion of the end surface 73 that is positioned between the two projections 75 forms. The tip-side part 7b is a portion that is offset toward the tip 513 of the drain terminal 51 or the tip 533 of the source terminal 53, between the drain terminal 51 and the source terminal 53 in the x direction. In the present embodiment, the tip-side part 7b is provided by a portion of the extremity of each of the two projections 75 in the y direction that is positioned between the drain terminal 51 and the source terminal 53. That is, the semiconductor device A1 has two tip-side parts 7b.

In the present embodiment, the sealing resin 7 has side recesses 78. The side recesses 78 are recessed from the front surface 71 and the side surfaces 74 and in the form of a rectangular parallelepiped in the illustrated example. The isolated parts 25 of the front electroconductive layer 2 are partially exposed from the side recesses 78. Each side recess 78 has a bottom surface 781. As shown in FIG. 10, the bottom surfaces 781 are flush with the exposed surfaces of the isolated parts 25.

The semiconductor device A1 having such a structure can be used, without limitation, in various applications, for example, as a constituent component of a pulse generator incorporated in apparatuses such as an experimental beam accelerator, a kicker, a medical cancer treatment system, an X-ray generator and a plasma generator, and a constituent component of a high-voltage power supply or a relay circuit, for example.

In the present embodiment, the drain terminal 51 and the source terminal 53 are arranged next to each other as shown in FIG. 4. Such an arrangement eliminates the need for configuring the conduction path connecting the drain terminal 51 and the drain electrode 41 and the conduction path connecting the source terminal 53 and the source electrode 43 so as to avoid the conduction path connecting the gate terminal 52 and the gate electrode 42 or the conduction path connecting the source sense terminal 54 and the source electrode 43. This reduces the necessity for providing a bent part or an extended part in the conduction path connecting the drain terminal 51 and the drain electrode 41 and the conduction path connecting the source terminal 53 and the source electrode 43, resulting in reduction of the inductances of these conduction paths. In particular, the conduction path connecting the source terminal 53 and the source electrode 43 is electrically connected to the conduction path connecting the source sense terminal 54 and the source electrode 43. When the source terminal 53 is at a reference potential in applying a gate driving voltage, if the inductance of the conduction path connecting the source terminal 53 and the source electrode 43 is excessively large, the electromotive force generated by the inductance cancels out or reduces the driving voltage applied across the gate terminal 52 and the source terminal 53. In the present embodiment, the source sense terminal 54 for applying the gate driving voltage is provided separately from the source terminal 53 that turns on the switching element 4 for allowing current to flow. Such an arrangement allows the driving voltage to be reliably applied without being influenced by the inductance of the conduction path connecting the source terminal 53 and the source electrode 43. When the switching element 4 is an SiC switching element, the transconductance, which is the gradient of the drain current with respect to the driving voltage, tends to be small as compared with that of an Si switching element, so that sufficient drain current cannot be obtained unless the driving voltage reaches a predetermined voltage. According to the present embodiment, however, sufficient drain current with current change of hundreds of amperes in one microsecond or less is quickly obtained, resulting in increased response speed. Moreover, as shown in FIGS. 1 and 4, the sealing resin 7 is formed with the root-side part 7a and the tip-side part 7b. The existence of the root-side part 7a and the tip-side part 7b increases the "along-surface distance", which is the distance connecting the point where the drain terminal 51 projects from the sealing resin 7 and the point where the source terminal 53 projects from the sealing resin 7 along the surface of the sealing resin 7. The longer the "along-surface distance" is, the higher the withstand voltage between the drain terminal 51 and the source terminal 53 is. Thus, the semiconductor device A1 achieves improved withstand voltage and response speed.

The root-side part 7a and the tip-side part 7b are easily provided between the drain terminal 51 and the source terminal 53 by providing the projections 75 that project from the end surface 73.

Further, as shown in FIG. 4, the distance d13 between the center line C1 of the drain terminal 51 and the center line C3 of the source terminal 53 in the x direction is larger than the distance d34 between the center line C3 of the source terminal 53 and the center line C4 of the source sense terminal 54 in the x direction and the distance d24 between the center line C4 of the source sense terminal 54 and the center line C2 of the gate terminal 52 in the x direction. Such an arrangement increases the along-surface distance between the drain terminal 51 and the source terminal 53, which is favorable for improving the withstand voltage.

The source terminal 53 and the source sense terminal 54 are arranged next to each other. Thus, the conduction path connecting the gate electrode 42 and the gate terminal 52 does not need to be provided between the conduction path connecting the source electrode 43 and the source terminal 53 and the conduction path connecting the source electrode 43 and the source sense terminal 54. This reduces the inductances of these conduction paths, which is favorable for improving the response speed.

The phantom line as an extension of the center line C3 of the source terminal 53 in the y direction intersects the switching element 4. With such an arrangement, the switching element 4 and the source terminal 53 are not undesirably far apart from each other, which contributes to the reduction of the resistance and inductance between the source electrode 43 and the source terminal 53. The larger the inductance of the current path formed by the drain terminal 51, the switching element 4 and the source terminal 53 is, the larger electromotive force is generated by such an inductance part at the time of switching off. When the electromotive force is excessively large, the element withstand voltage may be exceeded, resulting in a breakdown. In the present embodiment, while the use of the source sense terminal 54 enables high-speed switching, the inductance between the source electrode 54 and the source terminal 53 is reduced, so that the element breakdown is prevented.

Moreover, in the present embodiment, the phantom line as an extension of the center line C1 of the drain terminal 51 in the y direction does not intersect the switching element 4. This means that the drain terminal 51 is sufficiently spaced apart from the source terminal 53, which is favorable for improving the withstand voltage.

In the present embodiment, the phantom line as an extension of the center line C4 of the source sense terminal 54 in the y direction does not intersect the switching element 4. Note however that such an arrangement applies to the case where the dimension of the switching element 4 as viewed in the z direction is relatively small. Depending on the dimension of the switching element 4 or the like, the phantom line as an extension of the center line C4 of the source sense terminal 54 in the y direction may intersect the switching element 4.

As shown in FIG. 10, the isolated parts 25 are exposed from the sealing resin 7 at the side recesses 78, and the upper surfaces of the isolated parts 25 in the figure are flush with the bottom surfaces 781. Thus, in forming the sealing resin 7 using a mold in the process of manufacturing the semiconductor device A1, the mold can be pressed against the isolated parts 25. The isolated parts 25 partially cover the substrate 1 and hence prevent the pressing force applied through the mold from being directly exerted to the substrate 1. This is favorable for preventing breakage of the substrate 1, which is made of ceramics. Also, the isolated parts 25 are spaced apart and insulated from the portions of the front electroconductive layer 2 that constitute various conduction paths. Thus, the isolated parts 25 exposed to the outer side of the semiconductor device A1 do not cause an unintended short-circuit or the like.

FIGS. 11-20 show other embodiments of the present disclosure. In these figures, the elements that are identical or similar to those of the foregoing embodiment are denoted by the same reference signs as those used for the foregoing embodiment.

Second Embodiment

Figure 11:
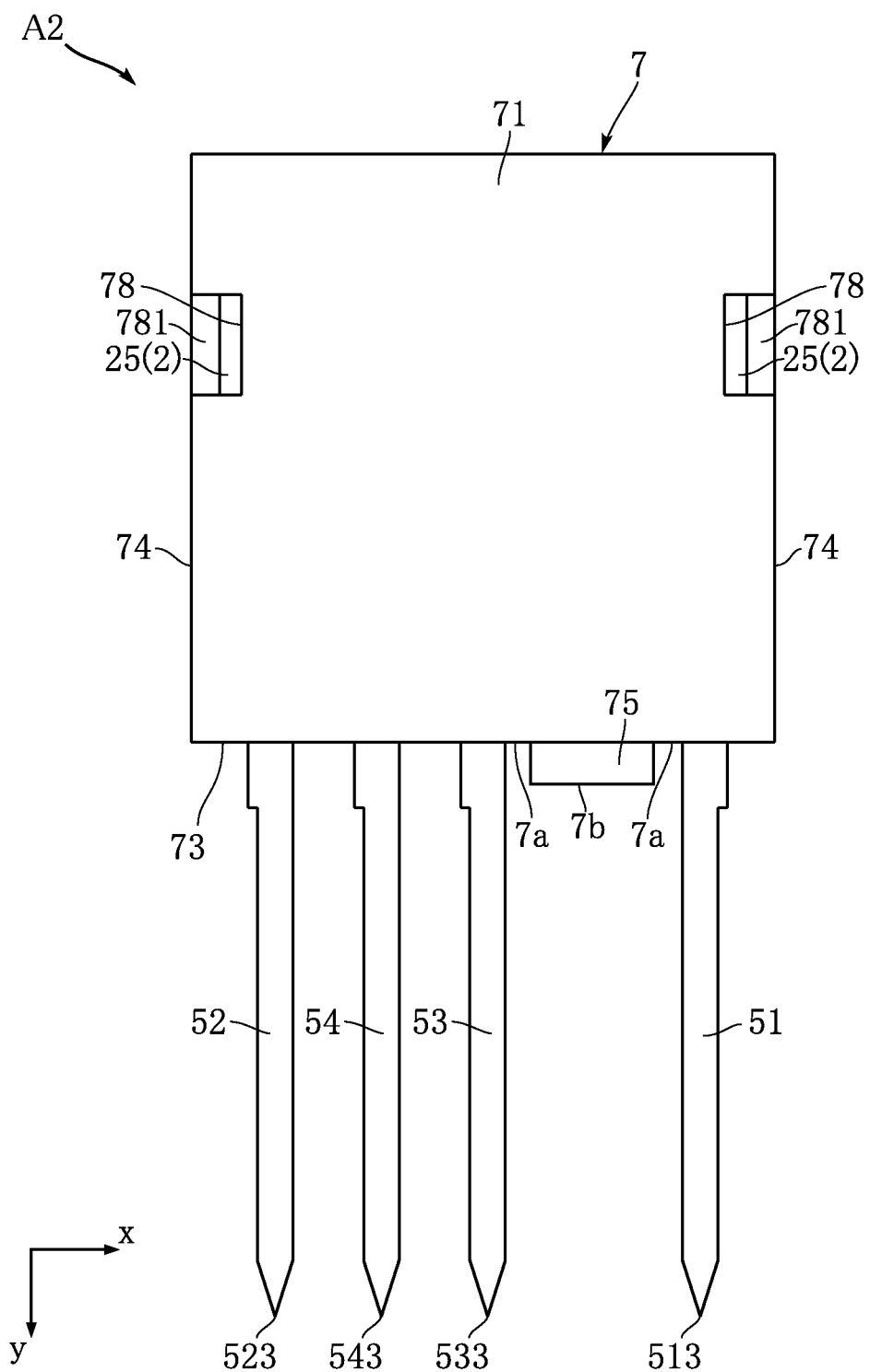
FIG. 11 is a plan view of a semiconductor device according to a second embodiment of the present disclosure.

FIG. 11 shows a semiconductor device according to a second embodiment of the present disclosure.

In the semiconductor device A2 of the present embodiment, the sealing resin 7 has a single projection 75. In the present embodiment, the projection 75 is positioned between the drain terminal 51 and the source terminal 53 in the x direction. The drain terminal 51, the gate terminal 52, the source terminal 53 and the source sense terminal 54 project from the end surface 73. Two root-side parts 7a are provided by the portion of the end surface 73 that is positioned between the drain terminal 51 and the projection 75 and the portion of the end surface 73 that is positioned between the source terminal 53 and the projection 75. Also, the tip-side part 7b is provided by the extremity of the projection 75 in the y direction.

The semiconductor device A2 according to this embodiment also achieves improved withstand voltage and response speed.

Third Embodiment

Figure 12:
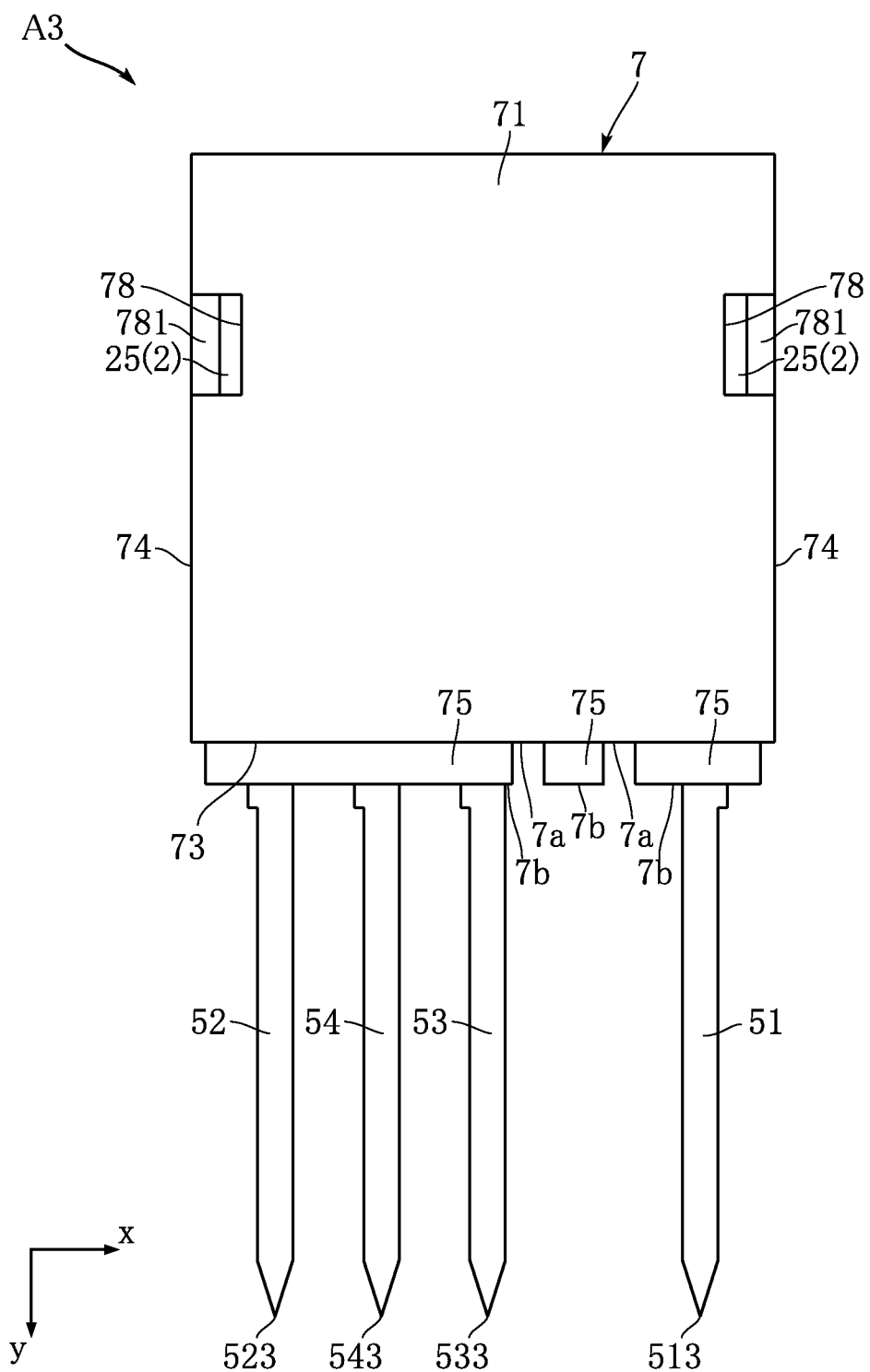
FIG. 12 is a plan view of a semiconductor device according to a third embodiment of the present disclosure.

FIG. 12 shows a semiconductor device according to a third embodiment of the present disclosure.

In the semiconductor device A3 of the present embodiment, the sealing resin 7 has three projections 75. The three projections 75 are spaced apart from each other in the x direction. From the projection 75 on the right side in the figure projects the drain terminal 51. From the projection 75 on the left side in the figure project the gate terminal 52, the source terminal 53 and the source sense terminal 54. The projection 75 in the middle in the figure is located between the drain terminal 51 and the source terminal 53. None of the drain terminal 51, the gate terminal 52, the source terminal 53 and the source sense terminal 54 project from this projection 75.

In the present embodiment, two root-side parts 7a are provided by the portions of the end surface 73 that are positioned between adjacent projections 75. Also, three tip-side parts 7b are provided by portions of the extremity in the y direction of the three projections 75 that are positioned between the drain terminal 51 and the source terminal 53.

The semiconductor device A3 according to this embodiment also achieves improved withstand voltage and response speed.

Fourth Embodiment

Figure 13:
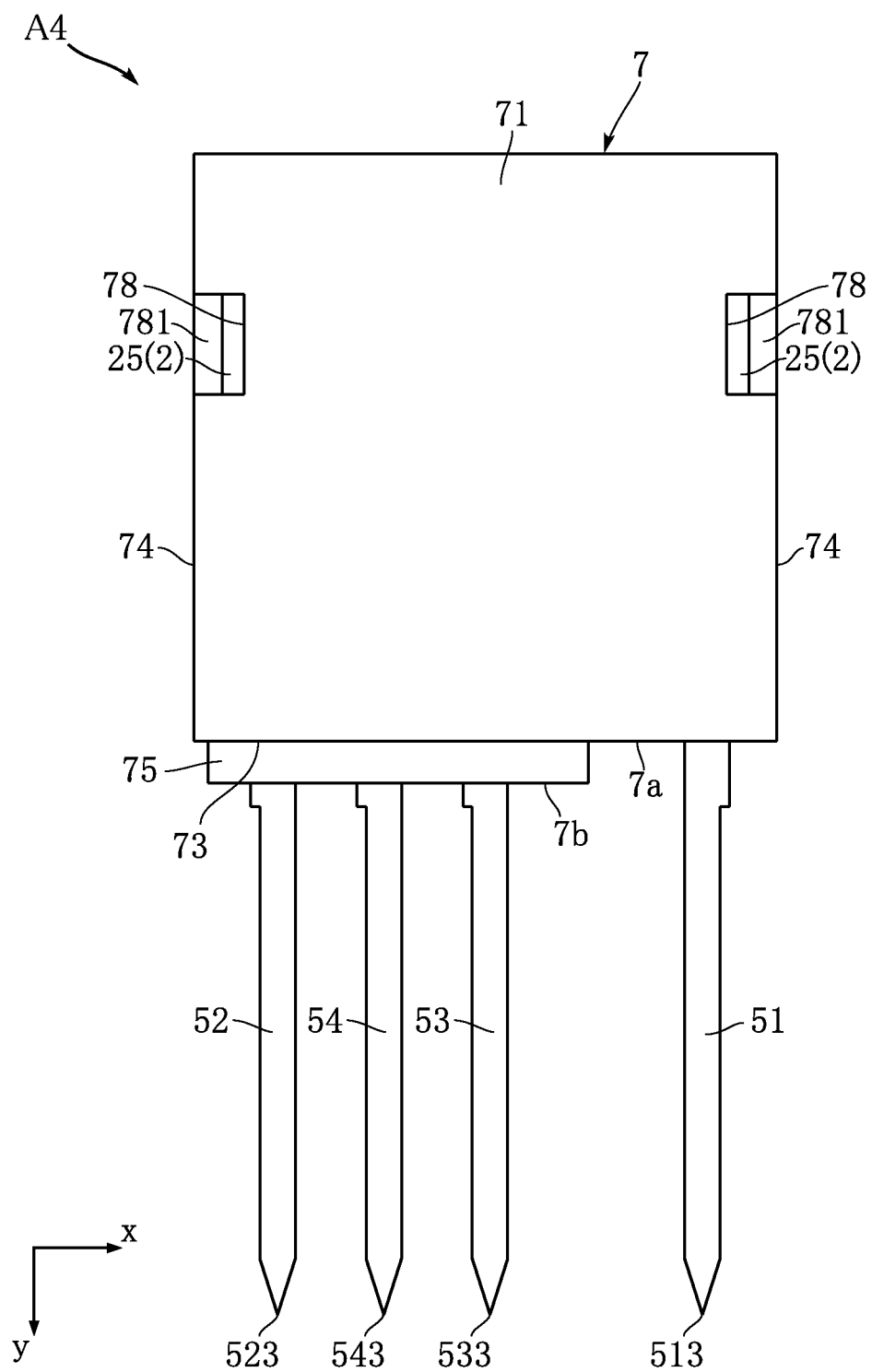
FIG. 13 is a plan view of a semiconductor device according to a fourth embodiment of the present disclosure.

FIG. 13 shows a semiconductor device according to a fourth embodiment of the present disclosure.

In the semiconductor device A4 of the present embodiment, the sealing resin 7 has a single projection 75. The drain terminal 51 projects from the end surface 73. The gate terminal 52, the source terminal 53 and the source sense terminal 54 project from the projection 75. In the present embodiment, the root-side part 7a is provided by a portion of the end surface 73 that is positioned between the drain terminal 51 and the source terminal 53. The tip-side part 7b is provided by a portion of the extremity in the y direction of the projection 75 that is positioned between the drain terminal 51 and the source terminal 53.

The semiconductor device A4 according to this embodiment also achieves improved withstand voltage and response speed.

Fifth Embodiment

Figure 14:
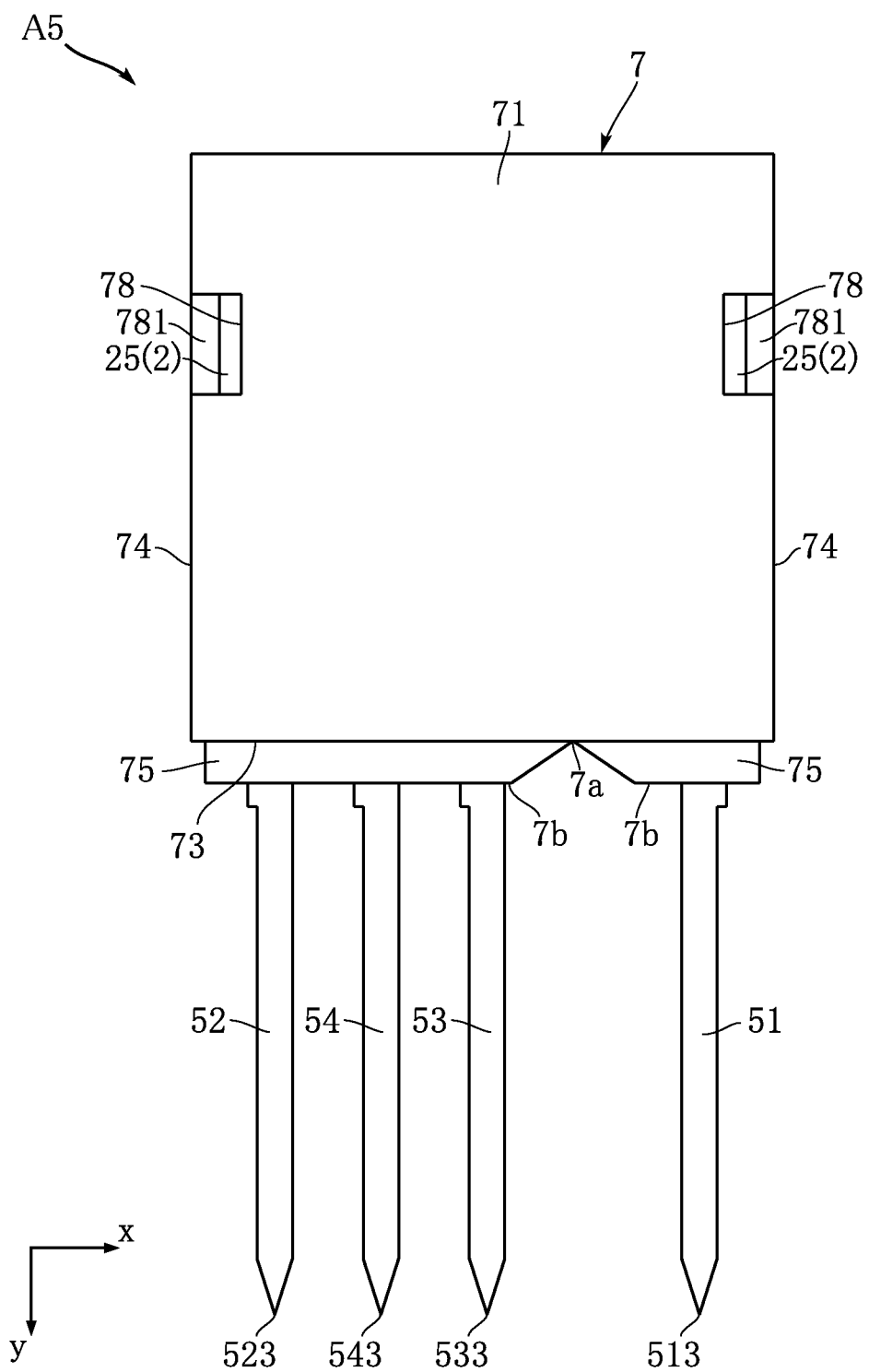
FIG. 14 is a plan view of a semiconductor device according to a fifth embodiment of the present disclosure.

FIG. 14 shows a semiconductor device according to a fifth embodiment of the present disclosure.

In the semiconductor device A5 according to the present embodiment, the sealing resin 7 has two projections 75. From the projection 75 on the right side in the figure projects the drain terminal 51. From the projection 75 on the left side in the figure project the gate terminal 52, the source terminal 53 and the source sense terminal 54. Each of the two projections 75 has an inclined surface that extends upward in the figure in the y direction from the extremity in the y direction. These inclined surfaces are connected to each other. In the present embodiment, the root-side part 7a is provided by the portion where the inclined surfaces of the two projections 75 are connected. Two tip-side parts 7b are provided by portions of the extremity in the y direction of the two projections 75 that are positioned between the drain terminal 51 and the source terminal 53.

The semiconductor device A5 according to this embodiment also achieves improved withstand voltage and response speed. The surface connecting the root-side part 7a and the tip-side part 7b may not necessarily extend along the y direction but may be inclined with respect to the y direction as is in the present embodiment.

Sixth Embodiment

Figure 15:
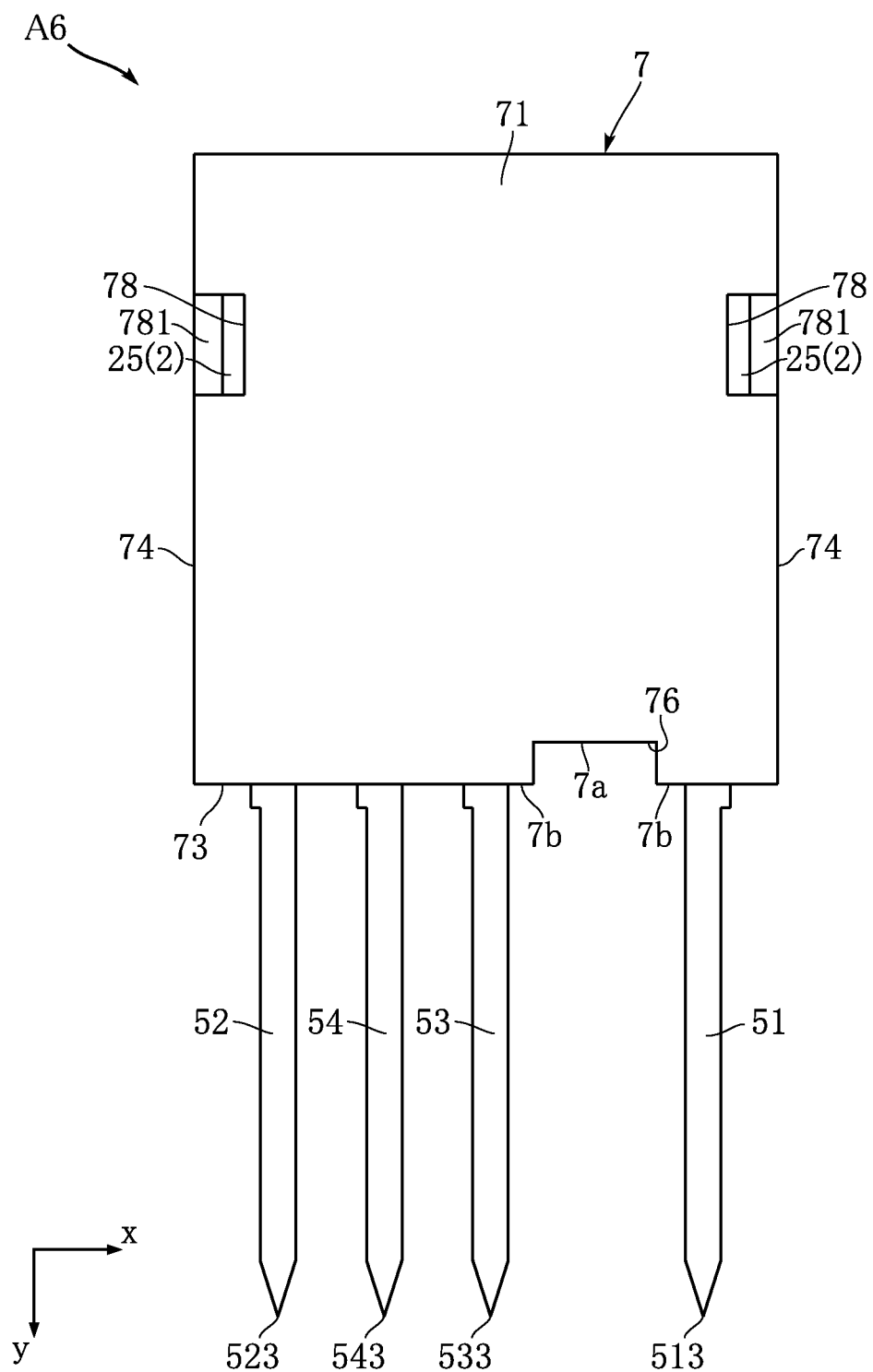
FIG. 15 is a plan view of a semiconductor device according to a sixth embodiment of the present disclosure.

FIG. 15 show a semiconductor device according to a sixth embodiment of the present disclosure.

In the semiconductor device A6 of the present embodiment, the sealing resin 7 does not have a projection 75 but has a recess 76. The recess 76 is recessed from the end surface 73 in the y direction between the drain terminal 51 and the source terminal 53. In the present embodiment, the root-side part 7a is provided by the bottom surface of the recess 76, and two tip-side parts 7b are provided by the portions of the end surface 73 that are positioned between the drain terminal 51 and the source terminal 53.

The semiconductor device A6 according to this embodiment also achieves improved withstand voltage and response speed.

Seventh Embodiment

Figure 16:
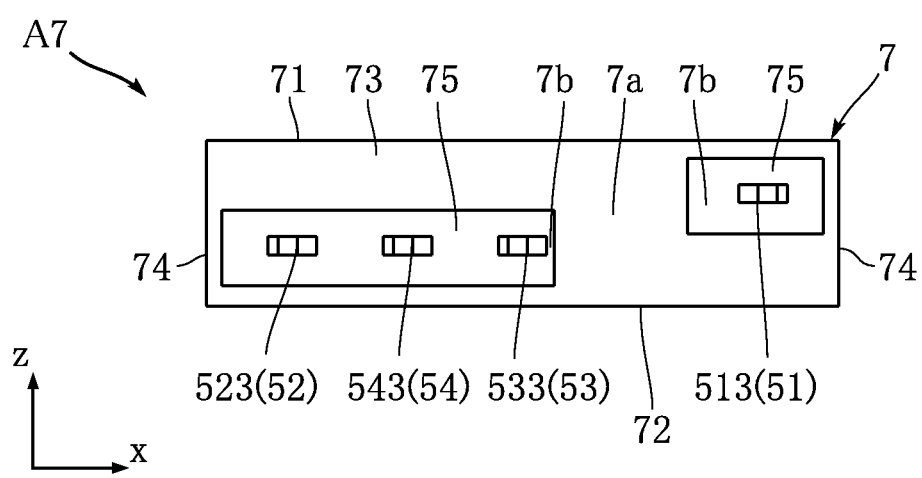
FIG. 16 is a front view of a semiconductor device according to a seventh embodiment of the present disclosure.

FIG. 16 shows a semiconductor device according to a seventh embodiment of the present disclosure.

In the semiconductor device A7 of the present embodiment, the tip 513 of the drain terminal 51 is located at a position different from the tip 523 of the gate terminal 52, the tip 533 of the source terminal 53 and the tip 543 of the source sense terminal 54 in the z direction. The tip 523 of the gate terminal 52, the tip 533 of the source terminal 53 and the tip 543 of the source sense terminal 54 are at the same position in the z direction. Also, in the z direction, the position where the drain terminal 51 projects from the sealing resin 7 is different from the position where the gate terminal 52, the source terminal 53 and the source sense terminal 54 project from the sealing resin 7. Such a configuration may be provided by differentiating the bending height of the bent part 512 from the bending height of the bent part 522, the bent part 532 and the bent part 542. In the illustrated example, the two projections 75 providing the root-side part 7a and the tip-side part 7b have a configuration similar to that in the semiconductor device A1, though the configurations in the semiconductor devices A2-A6 may be employed.

The semiconductor device A7 according to this embodiment also achieves improved withstand voltage and response speed. Also, this embodiment increases the along-surface distance between the drain terminal 51 and the source terminal 53 by an amount corresponding to the difference in the z direction between the position where the drain terminal 51 projects from the sealing resin 7 and the position where the source terminal 53 projects from the sealing resin 7. This is favorable for improving the withstand voltage of the semiconductor device A7. Also, when the semiconductor device A7 is mounted on a printed board, a sufficient along-surface distance between the drain terminal 51 and the source terminal 53 is easily secured on the printed board.

Eighth Embodiment

Figure 17:
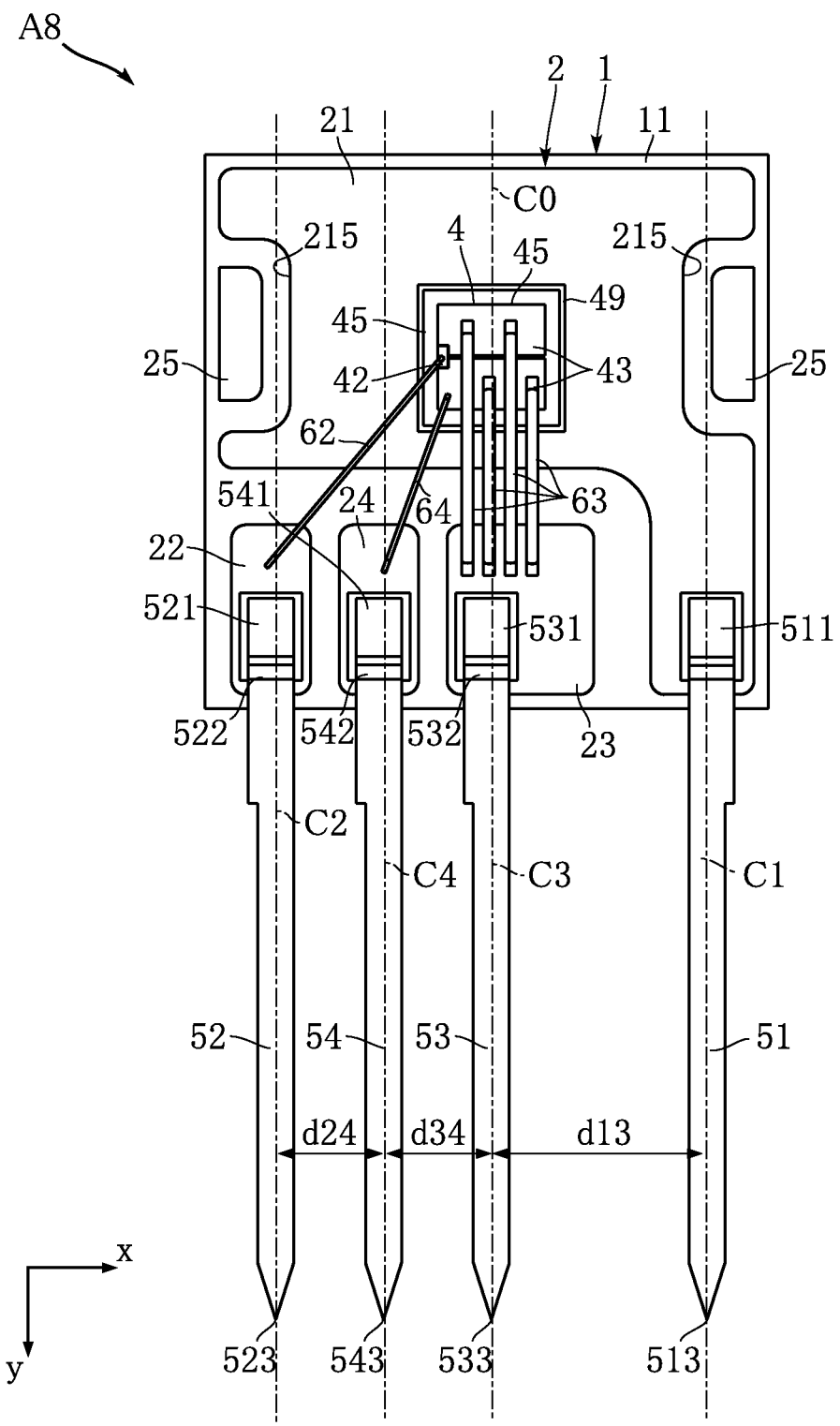
FIG. 17 is a plan view showing main parts of a semiconductor device according to an eighth embodiment of the present disclosure.

FIG. 17 shows a semiconductor device according to an eighth embodiment of the present disclosure.

In the semiconductor device A8 of the present embodiment, the front electroconductive layer 2 has a gate electrode part 22 and an auxiliary source electrode part 24 in addition to the drain electrode part 21, the source electrode part 23 and the two isolated parts 25. The gate electrode part 22 and the auxiliary source electrode part 24 are made of the same material as the drain electrode part 21, the source electrode part 23 and the two isolated parts 25. The gate electrode part 22 is the second electrode of the present disclosure. The auxiliary source electrode part 24 is the auxiliary third electrode of the present disclosure.

In the x direction, the auxiliary source electrode part 24 is spaced apart from the source electrode part 23 so as to be opposite, with respect to the source electrode part 23, to the portion of the drain electrode part 21 to which the bond part 511 is bonded. In the present embodiment, the bond part 541 of the source sense terminal 54 is conductively bonded to the auxiliary source electrode part 24. The source sense wire 64 is also connected to the auxiliary source electrode part 24. Thus, the source electrode 43 of the switching element 4 and the source terminal 53 are electrically connected to each other via the source sense wire 64 and the auxiliary source electrode part 24.

In the x direction, the gate electrode part 22 is spaced apart from the auxiliary source electrode part 24 so as to be opposite, with respect to the auxiliary source electrode part 24, to the source electrode part 23. In the present embodiment, to the gate electrode part 22 is conductively bonded the bond part 521 of the gate terminal 52. The gate wire 62 is also connected to the gate electrode part 22. Thus, the gate electrode 42 of the switching element 4 and the gate terminal 52 are electrically connected to each other via the gate wire 62 and the gate electrode part 22.

The semiconductor device A8 according to this embodiment also achieves improved withstand voltage and response speed. Further, bonding the gate terminal 52 to the gate electrode part 22 and the source sense terminal 54 to the auxiliary source electrode part 24 enhances the bonding strength of the gate terminal 52 and the source sense terminal 54. Accordingly, the relative position between each of the terminals and the substrate 1 is securely fixed, which allows each terminal to be reliably fixed at a proper position in the mold in molding the sealing resin 7.

Ninth Embodiment

Figure 18:
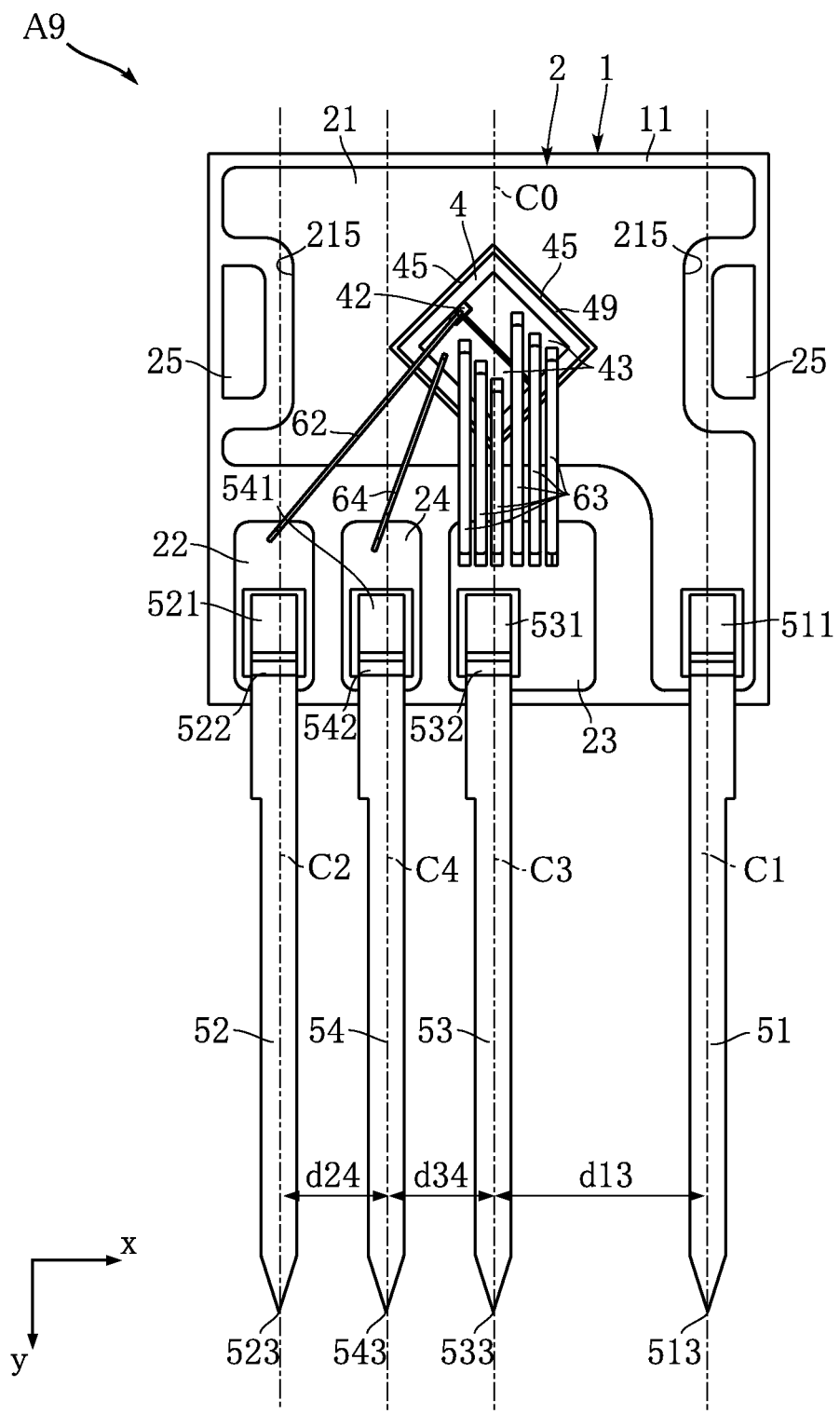
FIG. 18 is a plan view showing main parts of a semiconductor device according to a ninth embodiment of the present disclosure.

FIG. 18 shows a semiconductor device according to a ninth embodiment of the present disclosure.

The semiconductor device A9 of the present embodiment differs from the foregoing embodiments in arrangement of the switching element 4. In the present embodiment, all of the four outer edges 45 of the switching element 4 are inclined with respect to the x direction and the y direction. In the illustrated example, the four outer edges 45 are inclined 45 degrees with respect to the x direction and the y direction.

The source electrode 43 covers most part of the switching element 4 as viewed in the z direction and is generally rectangular. Because of the above-described arrangement of the switching element 4, the diagonals of the source electrode 43 extend along the x direction and the y direction. With such an arrangement, the maximum dimension of the source electrode 43 in the x direction is larger than that in the foregoing embodiments. In response to this, the number of source wires 63 connected to the source electrode 43 is increased to six in the illustrated example.

The semiconductor device A9 according to this embodiment also achieves improved withstand voltage and response speed. Increasing the number of source wires 63 reduces the resistance and inductance between the source electrode 43 and the source terminal 53. This is favorable for improving the response speed of the semiconductor device A9. The semiconductor device A9 has the front electroconductive layer 2 that includes the gate electrode part 22 and the auxiliary source electrode part 24, though it may have a configuration similar to the semiconductor device A1, which does not have the gate electrode part 22 and the auxiliary source electrode part 24.

Tenth Embodiment

Figure 19:
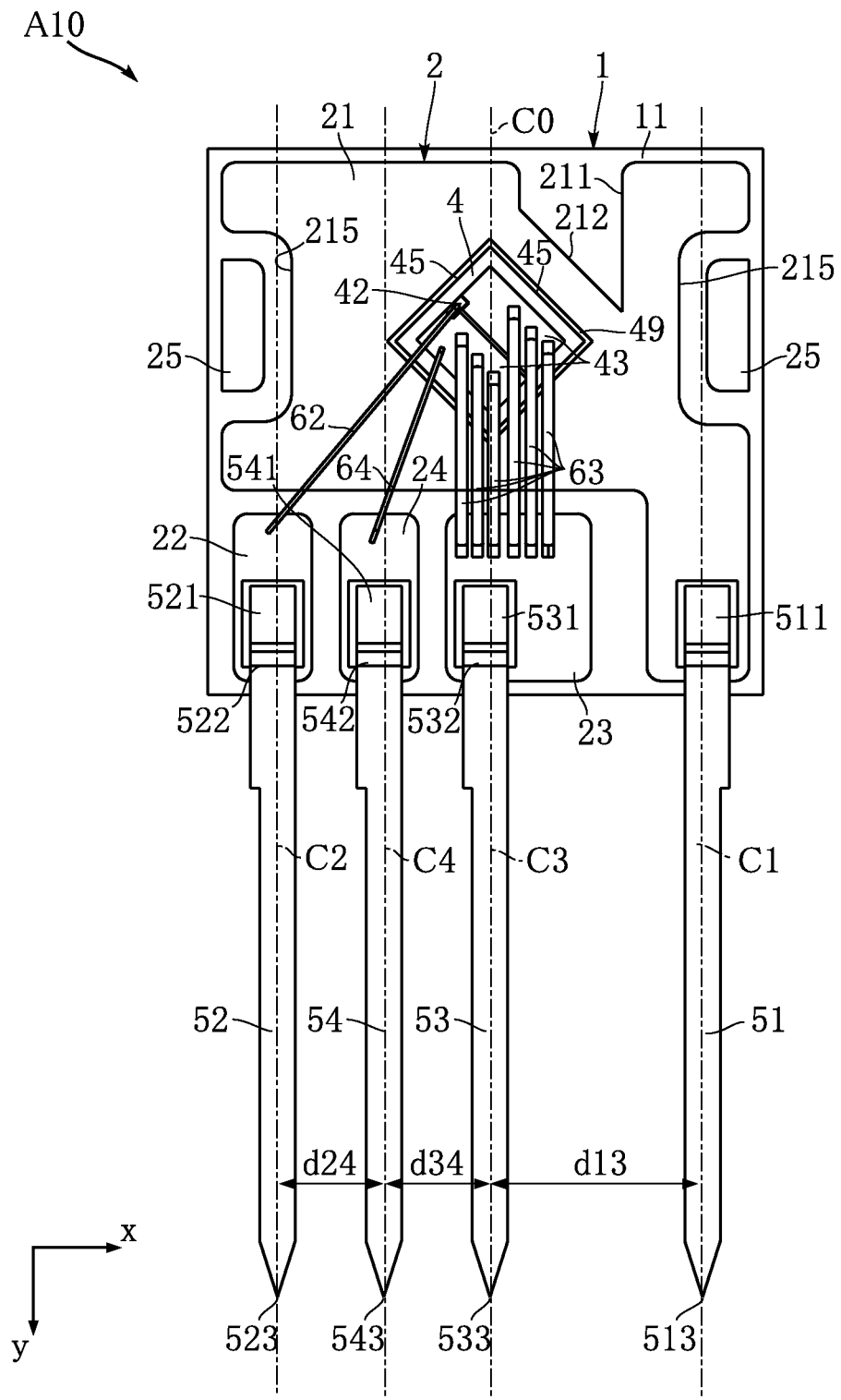
FIG. 19 is a plan view showing main parts of a semiconductor device according to a tenth embodiment of the present disclosure.

FIG. 19 shows a semiconductor device according to a tenth embodiment of the present disclosure.

In the semiconductor device A10 of the present embodiment, the switching element 4 is arranged in the same manner as is in the semiconductor device A9. The drain electrode part 21 of the front electroconductive layer 2 has a cutout 211. The cutout 211 is provided on the opposite side of the source electrode part 23 with respect to the switching element 4 in the y direction and recessed downward in the figure in the y direction. The cutout 211 has an oblique side 212. The oblique side 212 is inclined with respect to both the x direction and the y direction and is parallel to an outer edge 45 of the switching element 4. The oblique side 212 and the outer edge 45 are located next to each other.

The semiconductor device A10 according to this embodiment also achieves improved withstand voltage and response speed. Also, provision of the cutout 211 having the oblique side 212 in the drain electrode part 21 of the front electroconductive layer 2 allows the switching element 4 to be mounted on the drain electrode part 21 by using the oblique side 212 as a reference for the orientation of the switching element 4.

Eleventh Embodiment

Figure 20:
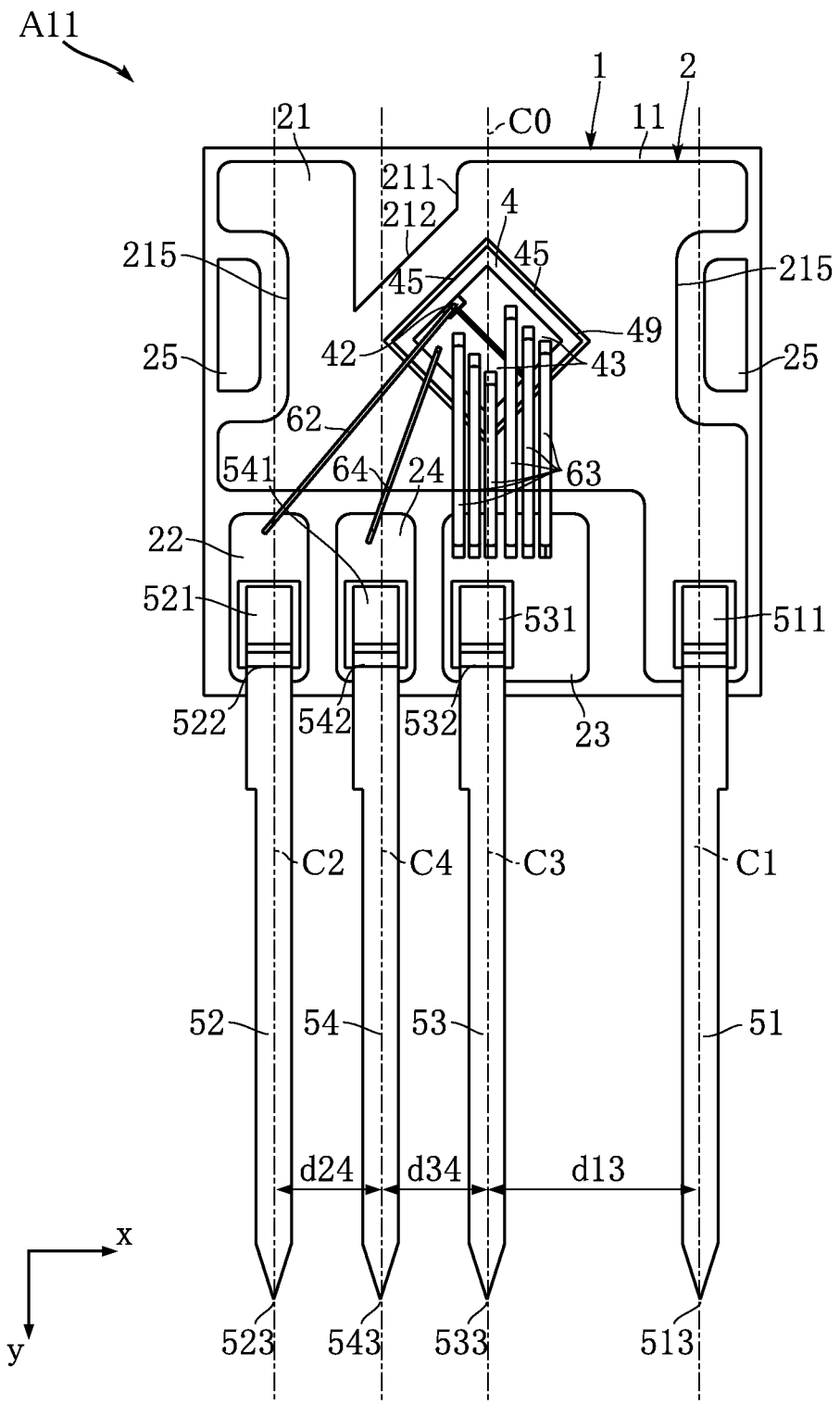
FIG. 20 is a plan view showing main parts of a semiconductor device according to an eleventh embodiment of the present disclosure.

FIG. 20 shows a semiconductor device according to an eleventh embodiment of the present disclosure.

In the semiconductor device A11 of the present embodiment, the switching element 4 is arranged in the same manner as is in the semiconductor devices A9 and A10. The drain electrode part 21 of the front electroconductive layer 2 has a cutout 211. The cutout 211 is provided on the opposite side of the source electrode part 23 with respect to the switching element 4 in the y direction and recessed downward in the figure in the y direction. The cutout 211 of the present embodiment is on the opposite side of the cutout 211 of the semiconductor device A10 in the x direction across the center line C3. The cutout 211 has an oblique side 212. The oblique side 212 is inclined with respect to both the x direction and the y direction and is parallel to an outer edge 45 of the switching element 4. The oblique side 212 and the outer edge 45 are located next to each other.

The semiconductor device A11 according to this embodiment also achieves improved withstand voltage and response speed. Also, provision of the cutout 211 having the oblique side 212 in the drain electrode part 21 of the front electroconductive layer 2 allows the switching element 4 to be mounted on the drain electrode part 21 by using the oblique side 212 as a reference for the orientation of the switching element 4.

The semiconductor device according to the present disclosure is not limited to the foregoing embodiments. The specific configuration of each part of the semiconductor device according to the present disclosure may be varied in many ways. For example, the source electrode and the source terminal may be connected via a flat metal plate instead of the wires, though the foregoing embodiments describe connection using the wires and the electrode part alone. Moreover, the source sense terminal may be replaced with another terminal for communicating other types of signals. Also, another terminal for communicating signals other than the source sense signals may be added. Instead of forming a front electroconductive layer on the insulating substrate and connecting the front electroconductive layer with the drain terminal, the switching element may be disposed on an island integrally formed with the drain terminal, and each electrode and each terminal may be directly connected to each other by a wire. Although the embodiments only describe the use of a single switching element, a plurality of switching element chips may be connected in parallel to each other or a protective diode chip may be incorporated.

The present disclosure includes embodiments according to the following clauses.

Clause 1.

A semiconductor device comprising:

a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;

a substrate having a front surface and a back surface and made of an insulating material;

a front electroconductive layer formed on the front surface of the substrate and including a first electrode part to which the first electrode of the switching element is bonded;

a first terminal electrically connected to the first electrode via the first electrode part;

a second terminal electrically connected to the second electrode;

a third terminal electrically connected to the third electrode; and a sealing resin that covers at least a part of the front electroconductive layer, a part of each of the first through the third terminals, and the switching element, wherein the first through the third terminals project toward a same side from the sealing resin along a first direction perpendicular to a thickness direction of the substrate, the first through the third terminals are spaced apart from each other in a second direction perpendicular to the thickness direction and the first direction, the first terminal is located at an outermost side in the second direction among the first through the third terminals, and the sealing resin includes:
a root-side part that is located between the first terminal and the third terminal in the second direction and offset in the first direction toward a switching element side of the first terminal and the third terminal; and
a tip-side part that is offset in the first direction toward a tip side of the first and the third terminals that is exposed from the sealing resin.

Clause 2.

The semiconductor device according to clause 1, wherein an along-surface distance of the sealing resin between the first terminal and the third terminal is longer than a distance between the first terminal and the third terminal.

Clause 3.

The semiconductor device according to clause 1 or 2, wherein the sealing resin has an end surface perpendicular to the first direction.

Clause 4

The semiconductor device according to clause 3, wherein the sealing resin has at least one projection, each of the at least one projection projecting in the first direction from the end surface toward the tip side of the first terminal, and the root-side part comprises the end surface, and the tip-side part comprises an end surface on the tip side of any one of the at least one projection.

Clause 5

The semiconductor device according to clause 4, wherein the at least one projection of the sealing resin includes a first projection and a second projection, the first terminal projects from the first projection, and
the third terminal projects from the second projection.

Clause 6.

The semiconductor device according to clause 3, wherein the sealing resin is formed with a recess that is recessed from the end surface in the first direction, and the root-side part comprises a deepest portion of the recess, and the tip-side part comprises the end surface.

Clause 7.

The semiconductor device according to any one of clauses 1-6, further comprising a fourth terminal electrically connected to the third electrode, the third terminal being located next to the first terminal, wherein a distance between the first terminal and the third terminal in the second direction is larger than a distance in the second direction between the third terminal and one of the second terminal and the fourth terminal that is located next to the third terminal.

Clause 8.

The semiconductor device according to clause 7, wherein the distance between the first terminal and the third terminal in the second direction is larger than a distance between the second terminal and the fourth terminal in the second direction.

Clause 9.

The semiconductor device according to clause 7 or 8, wherein the fourth terminal is located next to the third terminal.

Clause 10.

The semiconductor device according to any one of clauses 7-9, wherein a resistance and an inductance between the third electrode and a tip of the third terminal are smaller than a resistance and an inductance between the third electrode and a tip of the fourth terminal, respectively.

Clause 11.

The semiconductor device according to clause 10, wherein the third terminal and the fourth terminal are electrically connected to each other only via a conduction path that includes the third electrode.

Clause 12.

The semiconductor device according to any one of clauses 1-11, wherein a phantom line that is an extension, in the first direction, of a center line of the third terminal in the second direction intersects the switching element.

Clause 13.

The semiconductor device according to clause 12, wherein a phantom line that is an extension, in the first direction, of a center line of the first terminal in the second direction does not intersect the switching element.

Clause 14.

The semiconductor device according to any one of clauses 1-13, wherein the front electroconductive layer has an isolated part spaced apart from and insulated from the first electrode part, and the isolated part is partially exposed from the sealing resin.

Clause 15.

The semiconductor device according to any one of clauses 1-14, wherein the switching element is rectangular and has four outer edges, and each of the four outer edges extends along the first direction or the second direction.

Clause 16.

The semiconductor device according to any one of clauses 1-14, wherein the switching element is rectangular and has four outer edges, and each of the four outer edges is inclined with respect to both the first direction and the second direction.

Clause 17.

The semiconductor device according to clause 16, wherein the first electrode part is formed with a cutout having an oblique side parallel to the outer edge of the switching element.

Clause 18

The semiconductor device according to any one of clauses 1-17, wherein the first terminal and the third terminal project from the sealing resin at different positions in the thickness direction.

Clause 19.

The semiconductor device according to any one of clauses 1-18, wherein the front electroconductive layer includes a third electrode part which is spaced apart from the first electrode part and to which the third terminal is bonded.

Clause 20.

The semiconductor device according to clause 19, wherein the front electroconductive layer includes:
a second electrode part which is spaced apart from the first electrode part and to which the second terminal is bonded; and
an auxiliary third electrode part which is spaced apart from the first electrode part and the third electrode part and to which the fourth terminal is bonded.

Clause 21.

A semiconductor device comprising:
a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;
a substrate having a front surface and a back surface and made of an insulating material;
a front electroconductive layer formed on the front surface of the substrate and including a first electrode part to which the first electrode of the switching element is bonded;
a first terminal electrically connected to the first electrode via the first electrode part;
a second terminal electrically connected to the second electrode;
a third terminal electrically connected to the third electrode; and
a sealing resin that covers at least a part of the front electroconductive layer, a part of each of the first through the third terminals, and the switching element,
wherein the first through the third terminals project toward a same side from the sealing resin along a first direction perpendicular to a thickness direction of the substrate,
the first through the third terminals are spaced apart from each other in a second direction perpendicular to both the thickness direction and the first direction,
the first terminal is located at an outermost side in the second direction among the first through the third terminals, and
a distance between the first terminal and the third terminal in the second direction is larger than a distance between the third terminal and the second terminal in the second direction.

Clause 22.

The semiconductor device according to clause 21, further comprising a fourth terminal electrically connected to the third electrode and spaced further apart from the first terminal than the third terminal is, the third terminal being located next to the first terminal.

Clause 23.

The semiconductor device according to any one of clauses 1-22, wherein the switching element comprises an SiC switching element.

Clause 24.

The semiconductor device according to any one of clauses 1-23, wherein the first terminal is a drain terminal of the switching element, the second terminal is a gate terminal of the switching element, and the third terminal is a source terminal of the switching element.

Clause 25.

The semiconductor device according to clause 24, wherein the source terminal is exposed from the sealing resin almost at the center of the sealing resin as viewed in the first direction.

Clause 26.

The semiconductor device according to any one of clauses 1-25, further comprising a back electroconductive layer formed on the back surface of the substrate and exposed from the sealing resin.

Clause 27.

A semiconductor device comprising: a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;
a first terminal including a first electrode part to which the first electrode of the switching element is bonded;
a second terminal electrically connected to the second electrode;
a third terminal electrically connected to the third electrode; and
a sealing resin that covers at least a part of the first electrode part, a part of each of the first through the third terminals, and the switching element;
wherein the first through the third terminals project toward a same side from the sealing resin along a first direction perpendicular to a thickness direction of the switching element,
the first through the third terminals are spaced apart from each other in a second direction perpendicular to both the thickness direction and the first direction,
the first terminal is located at an outermost side in the second direction among the first through the third terminals, and
the sealing resin includes:
 a root-side part that is located between the first terminal and the third terminal in the second direction and offset in the first direction toward a switching element side of the first terminal and the third terminal; and
 a tip-side part that is offset in the first direction toward a tip side of the first and/or the third terminals that is exposed from the sealing resin.

Clause 28.

The semiconductor device according to clause 27, wherein the first terminal is located at an outermost side in the second direction among the first through the third terminals,
the third terminal is located at a center in the second direction among the first through the third terminals, and
a distance between the first terminal and the third terminal in the second direction is larger than a distance between the third terminal and the second terminal in the second direction.

Clause 29.

A semiconductor device comprising: a switching element having a first electrode, a second electrode and a third electrode and configured such that ON/OFF control between the first electrode and the third electrode is provided by a driving voltage applied across the second electrode and the third electrode with a potential difference applied between the first electrode and the third electrode;

a first terminal including a first electrode part to which the first electrode of the switching element is bonded;

a second terminal electrically connected to the second electrode;

a third terminal electrically connected to the third electrode;

a fourth terminal electrically connected to the third electrode; and a sealing resin that covers at least a part of the first electrode part, a part of each of the first through the fourth terminals, and the switching element;

wherein the first through the fourth terminals project toward a same side from the sealing resin along a first direction perpendicular to a thickness direction of the switching element, the first through the fourth terminals are spaced apart from each other in a second direction perpendicular to both the thickness direction and the first direction, the third terminal is located at a center in the second direction among the first through the fourth terminals, and an inductance between the third electrode and the third terminal is smaller than an inductance between the third electrode and the fourth terminal.

The invention claimed is:

1. A semiconductor device comprising:
   a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;
   a substrate having a front surface and a back surface and made of an insulating material;
   a front electroconductive layer formed on the front surface of the substrate and including a first electrode part to which the first electrode of the switching element is bonded;
   a first terminal electrically connected to the first electrode via the first electrode part;
   a second terminal electrically connected to the second electrode;
   a third terminal electrically connected to the third electrode; and
   a sealing resin that covers at least a part of the front electroconductive layer, a part of each of the first through the third terminals, and the switching element,
   wherein the first through the third terminals project toward a same side from the sealing resin along a first direction perpendicular to a thickness direction of the substrate,
   the first through the third terminals are spaced apart from each other in a second direction perpendicular to the thickness direction and the first direction,
   the first terminal is located at an outermost side in the second direction among the first through the third terminals, and
   the sealing resin includes:
      a root-side part that is located between the first terminal and the third terminal in the second direction and offset in the first direction toward a switching element side of the first terminal and the third terminal; and
      a tip-side part that is offset in the first direction toward a tip side of the first and the third terminals that is exposed from the sealing resin.

2. The semiconductor device according to claim 1, wherein an along-surface distance of the sealing resin between the first terminal and the third terminal is longer than a distance between the first terminal and the third terminal.

3. The semiconductor device according to claim 1, wherein the sealing resin has an end surface perpendicular to the first direction.

4. The semiconductor device according to claim 3, wherein the sealing resin has at least one projection, each of the at least one projection projecting in the first direction from the end surface toward the tip side of the first terminal, and
   the root-side part comprises the end surface, and the tip-side part comprises an end surface on the tip side of any one of the at least one projection.

5. The semiconductor device according to claim 4, wherein the at least one projection of the sealing resin includes a first projection and a second projection,
   the first terminal projects from the first projection, and
   the third terminal projects from the second projection.

6. The semiconductor device according to claim 3, wherein the sealing resin is formed with a recess that is recessed from the end surface in the first direction, and
   the root-side part comprises a deepest portion of the recess, and the tip-side part comprises the end surface.

7. The semiconductor device according to claim 1, further comprising a fourth terminal electrically connected to the third electrode, the third terminal being located next to the first terminal,
   wherein a distance between the first terminal and the third terminal in the second direction is larger than a distance in the second direction between the third terminal and one of the second terminal and the fourth terminal that is located next to the third terminal.

8. The semiconductor device according to claim 7, wherein the distance between the first terminal and the third terminal in the second direction is larger than a distance between the second terminal and the fourth terminal in the second direction.

9. The semiconductor device according to claim 7, wherein the fourth terminal is located next to the third terminal.

10. The semiconductor device according to claim 7, wherein a resistance and an inductance between the third electrode and a tip of the third terminal are smaller than a resistance and an inductance between the third electrode and a tip of the fourth terminal, respectively.

11. The semiconductor device according to claim 10, wherein the third terminal and the fourth terminal are electrically connected to each other only via a conduction path that includes the third electrode.

12. The semiconductor device according to claim 1, wherein a phantom line that is an extension, in the first direction, of a center line of the third terminal in the second direction intersects the switching element.

13. The semiconductor device according to claim 12, wherein a phantom line that is an extension, in the first direction, of a center line of the first terminal in the second direction does not intersect the switching element.

14. The semiconductor device according to claim 1, wherein the front electroconductive layer has an isolated part spaced apart from and insulated from the first electrode part, and the isolated part is partially exposed from the sealing resin.

15. The semiconductor device according to claim 1, wherein the switching element is rectangular and has four outer edges, and
each of the four outer edges extends along the first direction or the second direction.

16. The semiconductor device according to claim 1, wherein the switching element is rectangular and has four outer edges, and
each of the four outer edges is inclined with respect to both the first direction and the second direction.

17. The semiconductor device according to claim 16, wherein the first electrode part is formed with a cutout having an oblique side parallel to the outer edge of the switching element.

18. The semiconductor device according to claim 1, wherein the first terminal and the third terminal project from the sealing resin at different positions in the thickness direction.

19. The semiconductor device according to claim 1, wherein the front electroconductive layer includes a third electrode part which is spaced apart from the first electrode part and to which the third terminal is bonded.

20. The semiconductor device according to claim 19, wherein the front electroconductive layer includes:
a second electrode part which is spaced apart from the first electrode part and to which the second terminal is bonded; and
an auxiliary third electrode part which is spaced apart from the first electrode part and the third electrode part and to which the fourth terminal is bonded.

21. The semiconductor device according to claim 1, wherein the switching element comprises an SiC switching element.

22. The semiconductor device according to claim 1, wherein the first terminal is a drain terminal of the switching element, the second terminal is a gate terminal of the switching element, and the third terminal is a source terminal of the switching element.

23. The semiconductor device according to claim 22, wherein the source terminal is exposed from the sealing resin almost at the center of the sealing resin as viewed in the first direction.

24. The semiconductor device according to claim 1, further comprising a back electroconductive layer formed on the back surface of the substrate and exposed from the sealing resin.

25. A semiconductor device comprising:
a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;
a substrate having a front surface and a back surface and made of an insulating material;
a front electroconductive layer formed on the front surface of the substrate and including a first electrode part to which the first electrode of the switching element is bonded;
a first terminal electrically connected to the first electrode via the first electrode part;
a second terminal electrically connected to the second electrode;
a third terminal electrically connected to the third electrode; and
a sealing resin that covers at least a part of the front electroconductive layer, a part of each of the first through the third terminals, and the switching element,
wherein the first through the third terminals project toward a same side from the sealing resin along a first direction perpendicular to a thickness direction of the substrate,
the first through the third terminals are spaced apart from each other in a second direction perpendicular to both the thickness direction and the first direction,
the first terminal is located at an outermost side in the second direction among the first through the third terminals, and
a distance between the first terminal and the third terminal in the second direction is larger than a distance between the third terminal and the second terminal in the second direction.

26. The semiconductor device according to claim 25, further comprising a fourth terminal electrically connected to the third electrode and spaced further apart from the first terminal than the third terminal is, the third terminal being located next to the first terminal.

27. A semiconductor device comprising: a switching element having a first electrode, a second electrode and a third electrode and configured such that ON/OFF control between the first electrode and the third electrode is provided by a driving voltage applied across the second electrode and the third electrode while a potential difference is being applied between the first electrode and the third electrode;
a first terminal including a first electrode part to which the first electrode of the switching element is bonded;
a second terminal electrically connected to the second electrode;
a third terminal electrically connected to the third electrode; and
a sealing resin that covers at least a part of the first electrode part, a part of each of the first through the third terminals, and the switching element;
wherein the first through the third terminals project toward a same side from the sealing resin along a first direction perpendicular to a thickness direction of the switching element,
the first through the third terminals are spaced apart from each other in a second direction perpendicular to both the thickness direction and the first direction,
the first terminal is located at an outermost side in the second direction among the first through the third terminals, and
the sealing resin includes:
a root-side part that is located between the first terminal and the third terminal in the second direction and offset in the first direction toward a switching element side of the first terminal and the third terminal; and
a tip-side part that is offset in the first direction toward a tip side of the first and/or the third terminals that is exposed from the sealing resin.

28. The semiconductor device according to claim 27, wherein the first terminal is located at an outermost side in the second direction among the first through the third terminals,
the third terminal is located at a center in the second direction among the first through the third terminals, and a distance between the first terminal and the third terminal in the second direction is larger than a distance between the third terminal and the second terminal in the second direction.

29. A semiconductor device comprising: a switching element having a first electrode, a second electrode and a third electrode and configured such that ON/OFF control between the first electrode and the third electrode is provided by a driving voltage applied across the second electrode and the third electrode with a potential difference applied between the first electrode and the third electrode;

a first terminal including a first electrode part to which the first electrode of the switching element is bonded;

a second terminal electrically connected to the second electrode;

a third terminal electrically connected to the third electrode;

a fourth terminal electrically connected to the third electrode; and a sealing resin that covers at least a part of the first electrode part, a part of each of the first through the fourth terminals, and the switching element;

wherein the first through the fourth terminals project toward a same side from the sealing resin along a first direction perpendicular to a thickness direction of the switching element, the first through the fourth terminals are spaced apart from each other in a second direction perpendicular to both the thickness direction and the first direction, the third terminal is located at a center in the second direction among the first through the fourth terminals, and an inductance between the third electrode and the third terminal is smaller than an inductance between the third electrode and the fourth terminal.

* * * * *